United States Patent [19]

Merrill et al.

[11] 4,286,048
[45] Aug. 25, 1981

[54] PHOTOCROSSLINKABLE COMPOSITIONS FOR SCREEN PRINTING STENCILS

[75] Inventors: Richard E. Merrill, Wakefield; Arthur A. Massucco, Natick, both of Mass.

[73] Assignee: Arthur D. Little, Inc., Cambridge, Mass.

[21] Appl. No.: 186,200

[22] Filed: Sep. 11, 1980

Related U.S. Application Data

[60] Division of Ser. No. 99,617, Dec. 3, 1979, which is a division of Ser. No. 970,196, Dec. 18, 1978, Pat. No. 4,209,582, which is a continuation-in-part of Ser. No. 770,272, Feb. 22, 1977, abandoned.

[51] Int. Cl.³ .......................... G03C 1/68; G03C 5/00
[52] U.S. Cl. .................................. 430/284; 204/159.19; 430/308; 430/325; 430/927; 525/127; 525/454
[58] Field of Search .................. 204/159.19; 525/127, 525/454; 430/284, 308, 325, 927

[56] References Cited

U.S. PATENT DOCUMENTS

| | | | |
|---|---|---|---|
| 3,035,004 | 5/1962 | Glavis | 260/29.7 W |
| 3,459,790 | 8/1969 | Smith | 260/874 X |
| 3,493,500 | 2/1970 | Volk et al. | 260/874 X |
| 3,773,857 | 11/1973 | Kondo et al. | 260/859 R |
| 3,850,770 | 11/1973 | Juna et al. | 204/159.19 X |
| 3,865,898 | 2/1975 | Tobolsky | 260/859 R |
| 3,932,401 | 1/1976 | Berg et al. | 260/248 |
| 3,960,572 | 1/1976 | Ibata et al. | 204/159.19 |
| 4,209,582 | 6/1980 | Merrill et al. | 430/308 |
| 4,224,399 | 9/1980 | Merrill et al. | 430/282 |

Primary Examiner—Edward C. Kimlin

[57] ABSTRACT

Screen printing stencils are prepared by afixing to a printing screen substrate an indicia-defining, ultraviolet-sensitive film and cross-linking the film by exposure to ultraviolet radiation. The coating compositions used to form the film comprise copolyacrylate/polyurethane block copolymers, in which the copolyacrylate blocks are copolymers of at least one hydroxy-containing acrylate and at least one acrylate or methacrylate which may be partially substituted with bromine, ultraviolet initiators and cross-linking monomers. Screen printing stencils are provided which are compatible with both water-based and oil-based inks. The disclosed screen printing stencils are used in improved screen-printing methods.

25 Claims, 32 Drawing Figures

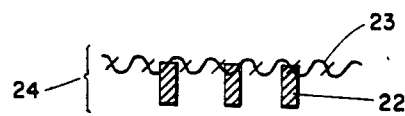
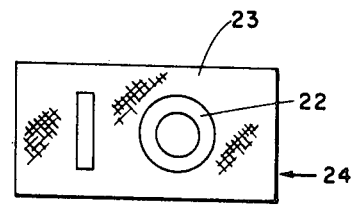
Fig. 9          Fig. 10
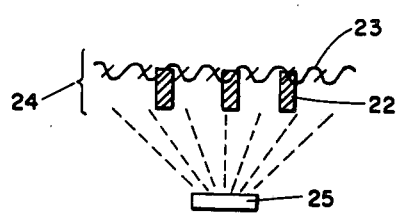
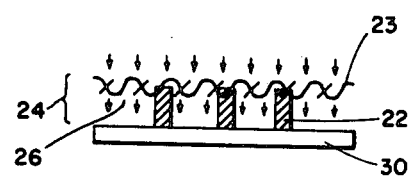
Fig. 11          Fig. 12
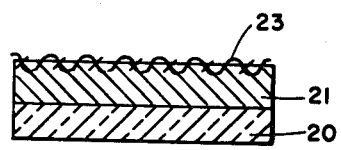
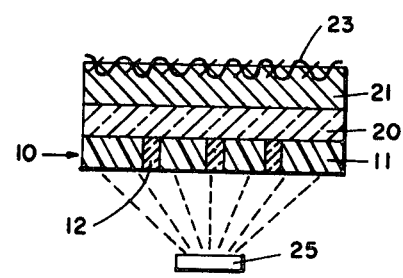
Fig. 13          Fig. 14
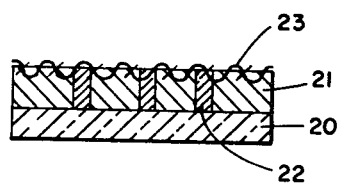
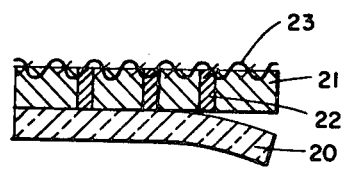
Fig. 15          Fig. 16

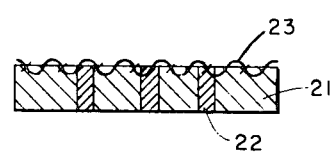
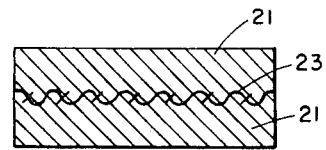
Fig. 17                    Fig. 18
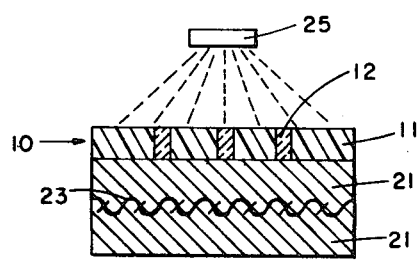
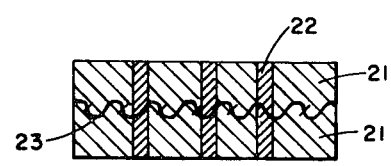
Fig. 19                    Fig. 20
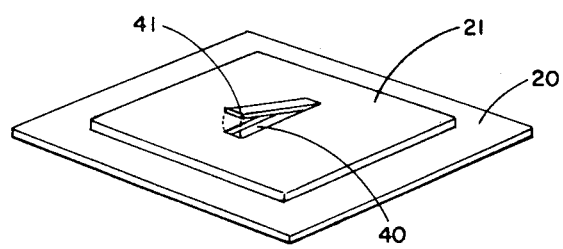
Fig. 21

PHOTOCROSSLINKABLE COMPOSITIONS FOR SCREEN PRINTING STENCILS

This application is a divisional application of our Ser. No. 099,617, filed Dec. 3, 1979, which in turn is a divisional case of Ser. No. 970,196, now U.S. Pat. No. 4,209,582 filed Dec. 18, 1978, as a continuation-in-part of Ser. No. 770,272, filed Feb. 22, 1977, and now abandoned.

This invention relates to novel block copolymers, to novel coating compositions for forming ultraviolet-sensitive films therefrom and to novel articles of manufacture incorporating the films and to the methods for forming the novel block copolymers, coating compositions and articles of manufacture. More particularly, this invention relates to screen printing stencils and to compositions and method for forming them and to screen printing.

The art of screen printing was developed around 1900 and was originally referred to as "silk-screen printing," the term being derived from the fine mesh silk which was originally used as the screen. According to this method of printing, a fine-mesh fabric such as silk or nylon, is stretched across a frame and an image is formed on the fabric. In its simplest form, a screen printing stencil is formed by gluing a hand cut paper stencil to the screen. The side of the screen printing stencil to which the paper stencil is attached is then placed against the surface to be imprinted, and ink is forced through the screen onto the surface to print on those areas of the surface not covered by pieces of the paper.

A more recent method of forming screen printing stencils involves the use of photosensitive coating compositions to deposit a film in which to form images in response to light transmitted through a master. One such method is disclosed in U.S. Pat. No. 3,246,986. In accordance with this method, a screen is coated with a "colloid", e.g., polymer emulsion containing a light sensitizer. The coated screen is allowed to dry and then exposed to light through a master such as a photographic negative. The light which passes through the master onto the coated screen causes the polymer to be hardened into a water-insoluble pattern corresponding to that of the master, while those areas of the coated screen protected from the light are unaffected and remain unhardened and water soluble. Thus, in effect, there is created a "latent image" which can be "developed" on the screen by washing it with water to leave the image-defining hardened material on the screen and to form a screen printing stencil. Various polymers and light sensitizers have been used to prepare the light-sensitive films used in this method. Typical polymers or colloids disclosed for this purpose are polyvinyl alcohol, partially acrylated polyvinyl alcohol, partially acrylated polyvinyl alcohol, partially hydrolyzed polyvinyl acetate, partially acetylated polyvinyl alcohol, polyacrylic acid, methyl cellulose and gelatin. Typical light-sensitizing compounds have included potassium dichromate, ammonium dichromate and condensation products of diazo diphenylamines with aldehydes.

However, these prior art methods of preparing screen printing stencils and the screen printing stencils prepared by such methods often have undesirable characteristics. For example, many of the screen printing stencils prepared by the prior art photochemical methods do not perform well with water-based inks since the indicia-defining materials are generally sensitive to the water-based inks which are usually alkaline in nature. Although screen printing stencils which are compatible with water-based inks may be prepared using certain lacquers, the lacquers used are not generally amenable to photochemical methods for preparing screen printing stencils.

Even where water insensitivity is not required, the prior art photochemical methods of preparing screen printing stencils are not completely satisfactory. In this regard, the use of dichromate light sensitizers is of particular concern, since they are generally environmentally unacceptable, poisonous compounds.

Therefore a need exists for a new method of preparing screen printing stencils, for new coating compositions and polymers useful in preparing screen printing stencils, for new screen printing stencils and for new screen printing methods.

It is therefore a primary object of this invention to provide a new photochemical method of preparing screen printing stencils without the use of the prior art diazo or dichromate light-sensitizing compounds. It is another object of this invention to provide new ultraviolet-cross-inkable liquid coating compositions for preparing screen printing stencils for printing with either water-based or oil-based inks. It is another primary object of this invention to provide new copolyacrylate/polyurethane block copolymers which, when cross-linked, form films having physical characteristics and solvent resistance suitable for coatings on screen printing stencils for use with either water-based or oil-based inks. It is yet another object of this invention to provide screen printing stencils and screen printing methods for printing with either water-based or oil-based inks. Other objects of the invention will in part be obvious and will in part be apparent hereinafter.

The invention accordingly comprises the several steps and the relation of one or more of such steps with respect to each of the others, the composition possessing the features, properties and the relation of constituents and the article possessing the features, properties and the relation of elements, all as exemplified in the detailed disclosure hereinafter set forth, and the scope of the invention will be indicated in the claims.

For a fuller understanding of the nature and object of this invention, reference should be had to the following detailed description taken in connection with the accompanying drawings in which FIGS. 1–11 illustrate the steps of one embodiment of a method for forming screen printing stencils in which both exposure of the ultraviolet-sensitive film and development of the indicia pattern are carried out before being stripped from a temporary support;

FIG. 12 illustrates the use of a screen printing stencil of this invention in printing on a receptor surface;

FIGS. 13–17 illustrate the steps of a second embodiment of a method for forming screen printing stencils in which the exposure of the ultraviolet-sensitive film is carried out before being stripped from a temporary support;

FIGS. 18–20 illustrate the steps of a third embodiment of a method for forming screen printing stencils wherein the ultraviolet-sensitive film is attached directly to the screen;

FIG. 21 illustrates the steps of a fourth embodiment of a method for forming screen printing stencils in which the indicia pattern is formed by cutting away portion of the film attached to a temporary support;

Figure 1:
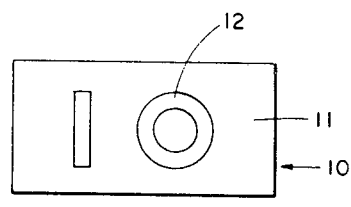

According to one aspect of this invention, there is provided a method of preparing a screen printing stencil, characterized by the step of affixing to a printing screen a film configured to define a predetermined indicia pattern, the film comprising a cross-linked block copolymer, the block copolymer being formed of blocks of copolyacrylate and polyurethane, the copolyacrylate comprising a copolymer of a hydroxy-containing acrylate and a second acrylate component which comprises one or more esters of acrylic acid or methacrylic acid or mixtures thereof; the film defining the indicia pattern being formed by applying a coating containing the block copolymer to a support to form thereon a cross-linkable film, cross-linking the cross-linkable film in the areas corresponding to the desired indicia pattern and removing the noncross-linked film.

According to another aspect of this invention there is provided a method of preparing a screen printing stencil, comprising the steps of affixing to a temporary support a coating composition comprising (1) a block copolymer formed of blocks of copolyacrylate and polyurethane, the copolyacrylate comprising a copolymer of a hydroxy-containing acrylate and a second acrylate component which comprises one or more esters of acrylic acid or methacrylic acid or mixtures thereof, (2) a solvent, (3) an ultraviolet initiator, and at least one (4) cross-linking promoter; drying the coating composition to form an ultraviolet-cross-linkable film on the support; producing a predetermined indicia pattern in the film; transferring the indicia pattern to a printing screen; and exposing the indicia pattern on the screen substrate to ultraviolet radiation thereby to form a printing screen stencil.

According to a further aspect of this invention there is provided a method of preparing a screen printing stencil, comprising the steps of affixing to a printing screen a film formed by drying a coating composition comprising (1) a block copolymer formed of blocks of a copolyacrylate and a polyurethane, the copolyacrylate comprising a copolymer of a hydroxy-containing acrylate and a second acrylate component which comprises one or more esters of acrylic acid or methacrylic acid or mixtures thereof, (2) a solvent removable in the drying, (3) an ultraviolet initiator, and at least one (4) cross-linking promoter; producing in the coating a predetermined indicia pattern by exposing the film on the printing screen to ultraviolet radiation through a master defining the indicia as a transparent pattern to cross-link the film in areas corresponding to the transparent pattern, and developing the indicia pattern by removing from the printing screen substrate that portion of the coating which is not cross-linked by exposure to ultraviolet radiation.

According to an additional aspect of this invention there is provided a screen printing stencil having indicia defined thereon in the form of a film attached to the printing screen of the stencil, the film comprising a cross-linked block copolymer formed of blocks of a copolyacrylate and a polyurethane, the copolyacrylate comprising a copolymer of a hydroxy-containing acrylate and a second acrylate component comprising one or more esters of acrylic acid or methacrylic acid or a mixture thereof.

According to yet another aspect of this invention there is provided an article of manufacture suitable for use in the formation of screen printing stencils, comprising in combination a temporary support; and an ultraviolet cross-linkable film removably affixed to the temporary support, the film comprising a block copolymer formed of blocks of a copolyacrylate and a polyurethane, the copolyacrylate comprising a copolymer of a hydroxy-containing acrylate and a second acrylate component which comprises one or more esters of acrylic acid or methacrylic acid or mixtures thereof; the film in its cross-linked form being further characterized as resistant to both water-based and oil-based printing inks.

According to a further aspect of this invention there is provided a liquid coating composition suitable for forming an ultraviolet-cross-linkable film on a substrate, comprising a block copolymer formed of blocks of copolyacrylate and a polyurethane, the copolyacrylate comprising a copolymer of a hydroxy-containing acrylate and a second acrylate component which comprises one or more esters of acrylic acid or methacrylic acid or a mixture thereof; a solvent for the block copolymer; an ultraviolet initiator, and at least one cross-linking promoter.

According to a still further aspect of this invention there are provided novel block copolymers which may be either formed of blocks of copolyacrylate and polyurethane, the copolyacrylate comprising a copolymer of a hydroxy-containing acrylate and an acrylate which is partially substituted with bromine or formed of blocks of copolyacrylate and polyurethane, the polyurethane being formed of two different polyethers and the copolyacrylate comprising a copolymer of a hydroxy-containing acrylate and a second acrylate component which comprises one or more esters of acrylic acid or methacrylic acid or mixtures thereof.

According to another aspect of this invention there is provided a method of making a block copolymer formed of copolycarylate and polyurethane blocks in which the polyurethane blocks are formed by reacting a prepolymer constituent with a diisocyanate; reacting the resulting diisocyanate-capped prepolymer with a hydroperoxide or dihydroperoxide to form a peroxycarbamate and then polymerizing the peroxycarbamate with a hydroxy-containing acrylate and a second acrylate constituent to form the block copolymer, characterized in that the prepolymer constituent comprises at least two polyethers.

According to a final aspect of this invention there is provided a method for forming a coating composition suitable for depositing on a substrate a film which is cross-linkable upon exposure to ultraviolet radiation, comprising the steps of forming a syrup of a copolyacrylate/polyurethane block copolymer, the syrup comprising a solution of the block copolymer having a solids concentration of at least 20% by weight; blending a minor portion of the syrup with an inert hydrophobic filler to form a film-forming polymer/filler blend; and blending into the remaining portion of the syrup the polymer/filler blend, an ultraviolet initiator and at least one cross-linking promoter thereby to form the coating composition.

Figure 32:
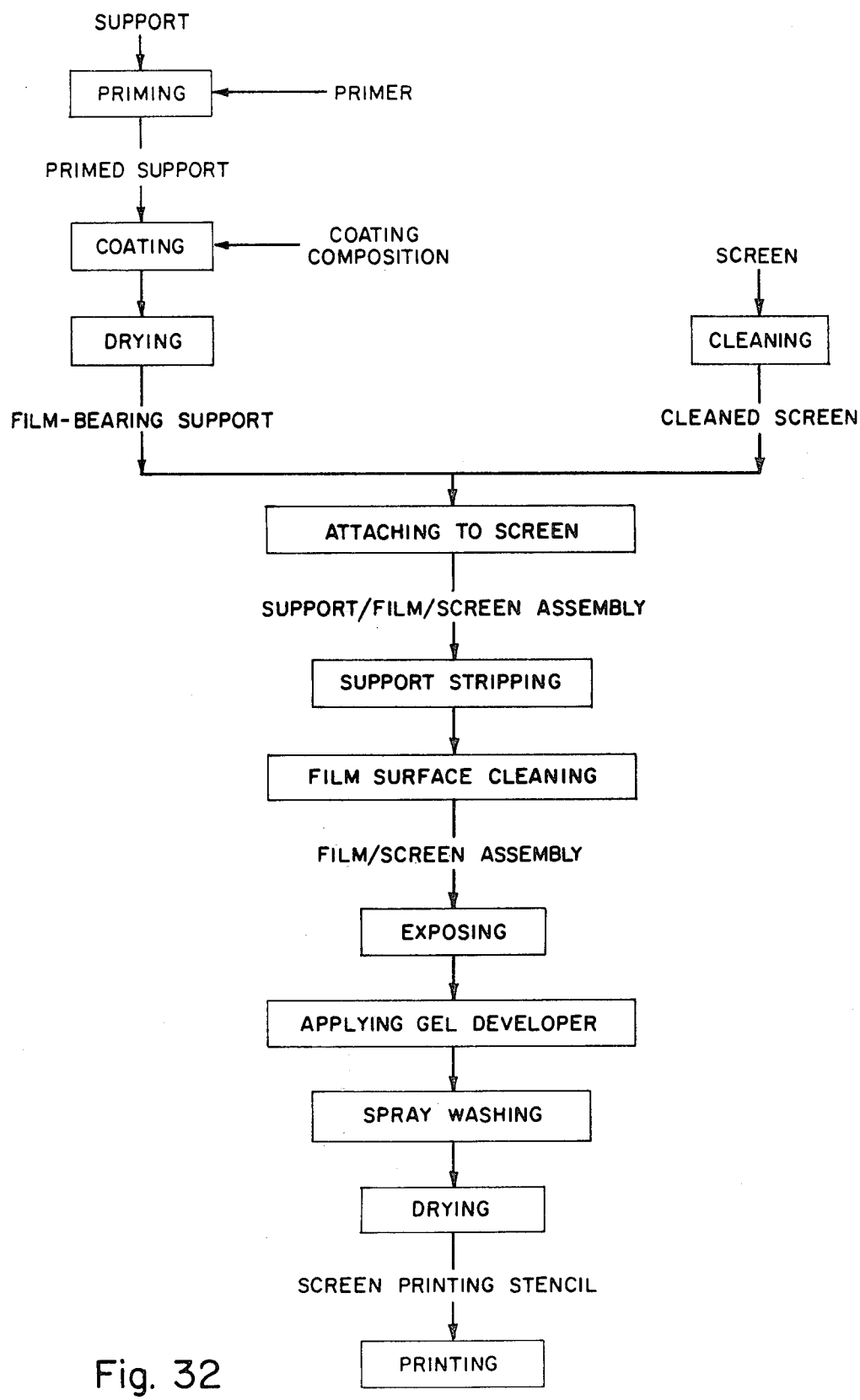
FIG. 32 is a flow diagram of a preferred method for forming the screen printing stencils of this invention.

Before describing the specific features of this invention, it will be helpful to describe in a general way several method embodiments for the preparation of screen printing stencils. This is done with reference to the diagrammatic illustrations in FIGS. 1–25 in which the same reference numerals are used to identify the same components and to the flow diagram of FIG. 32. Example 12 and FIGS. 22–25 and 32 describe in detail a preferred embodiment of the method of this invention for making screen printing stencils.

In the method embodiments of FIGS. 1–17, 21 and 22–25 the block copolymer coating composition is applied to a temporary support on which it forms a film; while in the method embodiment of FIGS. 18–20 the coating composition is applied directly to the screen material. Further, in the methods illustrated in FIGS. 1–17 the film remains on the support at least until after the exposure is made; while in FIGS. 22–25 it is transferred to the screen material before exposure.

FIG. 1 illustrates one type of master 10 which may be used in the method of this invention. This master is a negative transparency having a nontransparent background 11 and transparent indicia pattern 12. It is also, of course, within the scope of this invention to use any other suitable master such as a positive transparency which is the reverse of that shown in FIG. 1.

Figure 2:
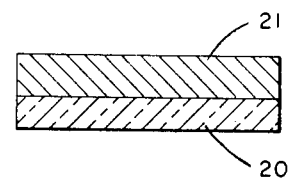

As shown in FIG. 2, the ultraviolet-sensitive coating composition of this invention, which sets up as a relatively hard ultraviolet-sensitive film 21, is applied to one side of a light transparent support 20, such as a polyethylene terephthalate film.

Figure 5:
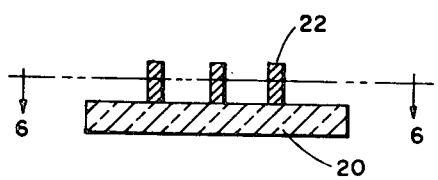
Figure 6:
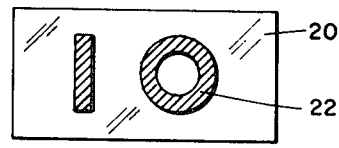

In the following descriptions and discussions, the film serving in the role of temporary support will be designated the "support"; and the term "film" will be reserved for the ultraviolet-sensitive film formed from the coating composition, the cross-linked film and the film forming the final indicia pattern. The coated support 20 is then (FIG. 3) exposed to an ultraviolet radiation source 25 through master 10, having ultraviolet-transparent indicia 12 and nontransparent background 11. The ultraviolet radiation passing through indicia 12 of master 10 causes the partial cross-linking 22 (FIG. 4) of a portion of the film 21 in a pattern corresponding to that of indicia 12, while the remainder of film 21, which is protected from irradiation by nontransparent background 11 of master 10, is essentially unaffected. Indicia 22 may then be "developed" on support 20 by placing the exposed film/support assembly in an etching bath containing a water/alcohol solution, such as ⅓ (by volume) water/ethyl alcohol, to dissolve away the unexposed coating film 21 leaving on the support only the exposed, partially cross-linked indicia-defining coating 22 as shown in FIGS. 5 and 6.

A preferred method of developing the indicia 22 involves the use of the gel developer described in our copending application Ser. No. 844,633. Through the use of the gel developer it is possible to achieve controlled release of a softening/swelling agent for the non-cross-linked unexposed portions of film 21 and subsequently to mechanically remove them by a pressurized water spray. The result is a screen printing stencil capable of producing prints of extremely good definition and copy quality.

Figure 7:
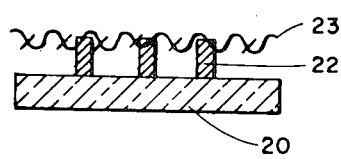

After indicia-defining coating 22 has been dried, the coated side of support 20 is brought into contact with a suitable screen 23 so that indicia-defining film 22 is between screen 23 and support 20, thus forming an assembly having the partially cross-linked film 22 interposed between support 20 and screen 23 as shown in FIG. 7. The indicia-defining film 22 extends up into the interstices of screen 23 to form a good bond. Screen 23 is then moistened with an appropriate solvent, such as the water/alcohol solution used in the development step, and allowed to stand for about 30 seconds to improve the adhesion of indicia-defining film 22 to screen 23. Alternatively, coated support 20 may be brought into contact with screen 23 while film 22 is still wet from the development step, in which case it will not be necessary to moisten the screen. Excess solvent may then be removed by blotting with a water-absorbent surface. The assembly shown in FIG. 7 is then air dried for about 15 minutes, after which support 20 is removed (FIG. 8) to leave indicia-defining film 22 on screen 23 to form a screen printing stencil 24 as shown in FIGS. 9 and 10. The coating-bearing side of screen printing stencil 24 is dried for about 10 minutes, and then film 22 on screen printing stencil 24 is post-cured by exposing it to ultraviolet radiation (FIG. 11) which completes the cross-linking of the partially-cross-linked, indicia-defining film 22 and promotes its bonding to screen 23.

FIG. 12 illustrates the use of the screen printing stencil of FIG. 11 in printing indicia onto a suitable receptor surface 30. As illustrated, the indicia-bearing side of screen printing stencil 24 is contacted with receptor surface 30. Printing ink is applied to the opposite side of screen printing stencil 24 and forced through those areas 26 (FIG. 12) of screen printing stencil 24 not blocked by indicia-defining film 22. That which passes through the screen printing stencil onto receptor surface 30 defines an indicia pattern on receptor surface 30 which is a right-reading copy of master 10.

FIGS. 13–18 illustrate the preparation of screen printing stencils in accordance with another embodiment of the method of this invention wherein exposure to the master, but not development, is carried out while the ultraviolet sensitive film is affixed to the support. As shown in FIG. 13, transparent support 20, which is coated with the block copolymer coating composition to form film 21, is brought into contact with screen 23 to create an assembly having film 21 interposed between support 20 and screen 23. Screen 23 is then moistened with an appropriate solvent, such as a water/alcohol solution or some of the original coating solution to ensure the bonding of screen 23 to film 21 on support 20. Excess solvent is removed by blotting with an absorbent surface. After the assembly has been dried in a manner not to induce premature cross-linking, it is exposed to ultraviolet radiation through indicia master 10, from the direction of the support side (FIG. 14). The ultraviolet radiation passes through transparent indicia 12 of master 10, then through transparent support 20 to film 21. This effects the partial cross-linking of those areas of film 21 corresponding to indicia 12 of master 10 (FIG. 15). The unexposed portions of film 21 remains noncross-linked.

Support 20 is then removed (FIG. 16) leaving the film (both the cross-linked portions 22 and noncross-linked portions 21) on screen 23 (FIG. 17). Indicia are then developed from the film on the screen by placing the screen in an etching bath of of an appropriate solution or by applying the gel developer of Ser. No. 844,633 and then washing with a water spray to leave the indicia-defining film 22 on the screen as previously shown in FIG. 9. The resulting unfinished screen printing stencil 24, carrying partially cross-linked indicia-defining film 22 adhered thereto, is then dried and exposed to ultraviolet radiation to complete the cross-linking of indicia-defining film 22, to promote its bonding to the screen (FIG. 11) and to provide a screen printing stencil as shown in FIGS. 9 and 10.

FIGS. 18–20 illustrate the preparation of screen printing stencils in accordance with still another method embodiment in which the coating composition is applied directly to the screen. In accordance with this embodiment, the block copolymer coating composition is applied directly to both sides of screen 23 to form a film 22, as shown in FIG. 18. Then, as shown in FIG. 19, coated screen 23 is exposed to ultraviolet radiation source 25 through master 10. The ultraviolet radiation passing through transparent indicia 12 of master 10 causes partial cross-linking (FIG. 20) of that part 22 of film 21 corresponding to the pattern of indicia 12, while the remainder of film 21 is unaffected. Indicia are then developed from the coating on the screen by one of the methods previously described. The screen is then dried and exposed to ultraviolet radiation to complete the cross-linking of film 22, to promote its bonding to the screen and to form a screen printing stencil.

FIG. 21 illustrates the preparation of screen printing stencils in accordance with a further method embodiment which begins with the application of the block copolymer coating composition to the surface of support 20. After drying, indicia pattern 40 is formed from film 21 on support 20 by cutting out a portion of the coating corresponding to the pattern and removing the excess portion 41 of the coating. The indicia pattern is then transferred to screen 23 and the indicia pattern defining film is cross-linked by exposure to ultraviolet radiation.

Figure 25:
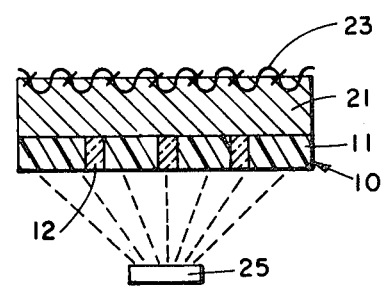

In the method embodiment illustrated in FIGS. 22–25, which is one preferred embodiment, the block copolymer coating composition is case on a support 20, carrying a primer or release coat 45 to form film 21 which is typically from about 0.3 mil to about three mils thick. After wiping the free surface of film 21 with denatured ethyl alcohol, used as a tackifier, a degreased screen 23 is adhered thereto and temporary support 20 removed. To ensure the complete removal of release coat 45, the surface 46 of film 21 is wiped off with a primer solvent such as hexane or naphtha. Master 10 is then brought into contact with surface 46 and exposure to ultraviolet radiation is accomplished as shown in FIG. 25. This results in the formation of an exposed film with cross-linked portions 22 and noncross-linked portions 21, as shown in FIG. 17. Development is then accomplished by removal of the noncross-linked portions, preferably through the use of the gel developer and the method described in Ser. No. 844,633, now abandoned.

The objects of this invention are attained through the use of a unique class of block copolymers and coating compositions made therefrom. The unique block copolymers of this invention are copolyacrylate/polyurethane block copolymers in which the copolyacrylate blocks are copolymers of at least one hydroxy-containing acrylate and a second acrylate comprising one or more esters of acrylic acid or methacrylic acid or mixtures thereof wherein the esters may be, but preferably are not, partially substituted with bromine. It is preferable that the block copolymers are prepared using polyethers; and it is even more preferable that at least two different polyethers are used in forming the polyurethane portion of the block copolymer.

Figure 26:
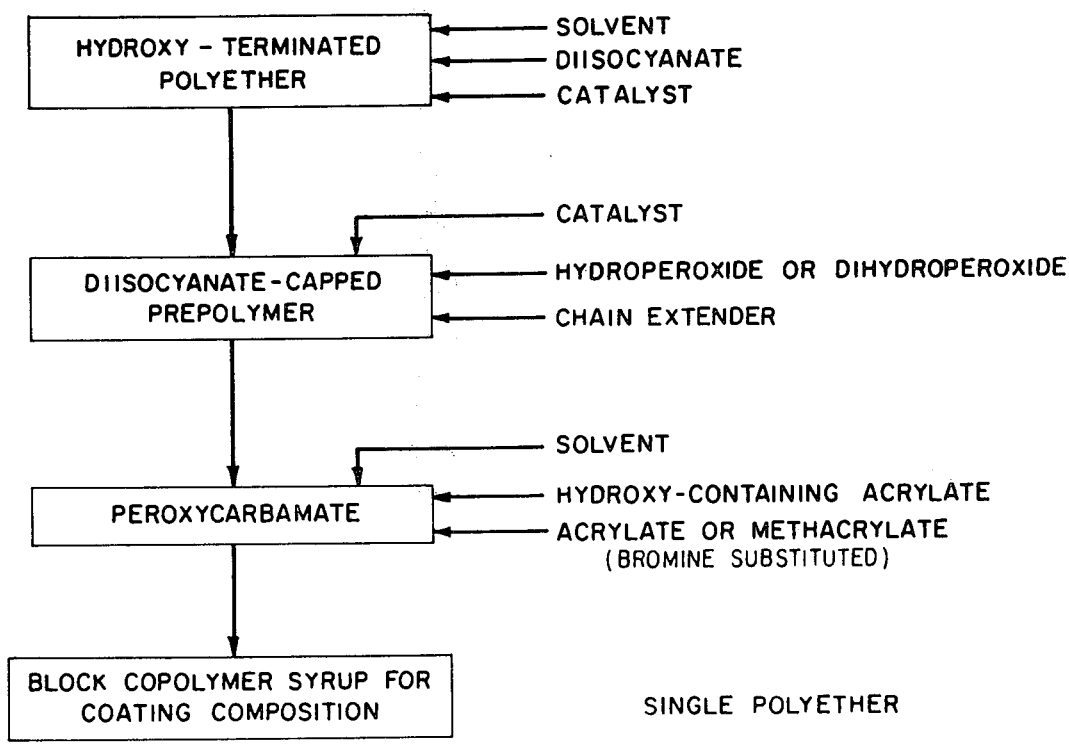
FIG. 26 is a flow diagram illustrating the preparation of a block copolymer syrup, based on a single prepolymer, used in formulating a coating composition suitable for forming the ultraviolet-sensitive film.
Figure 27:
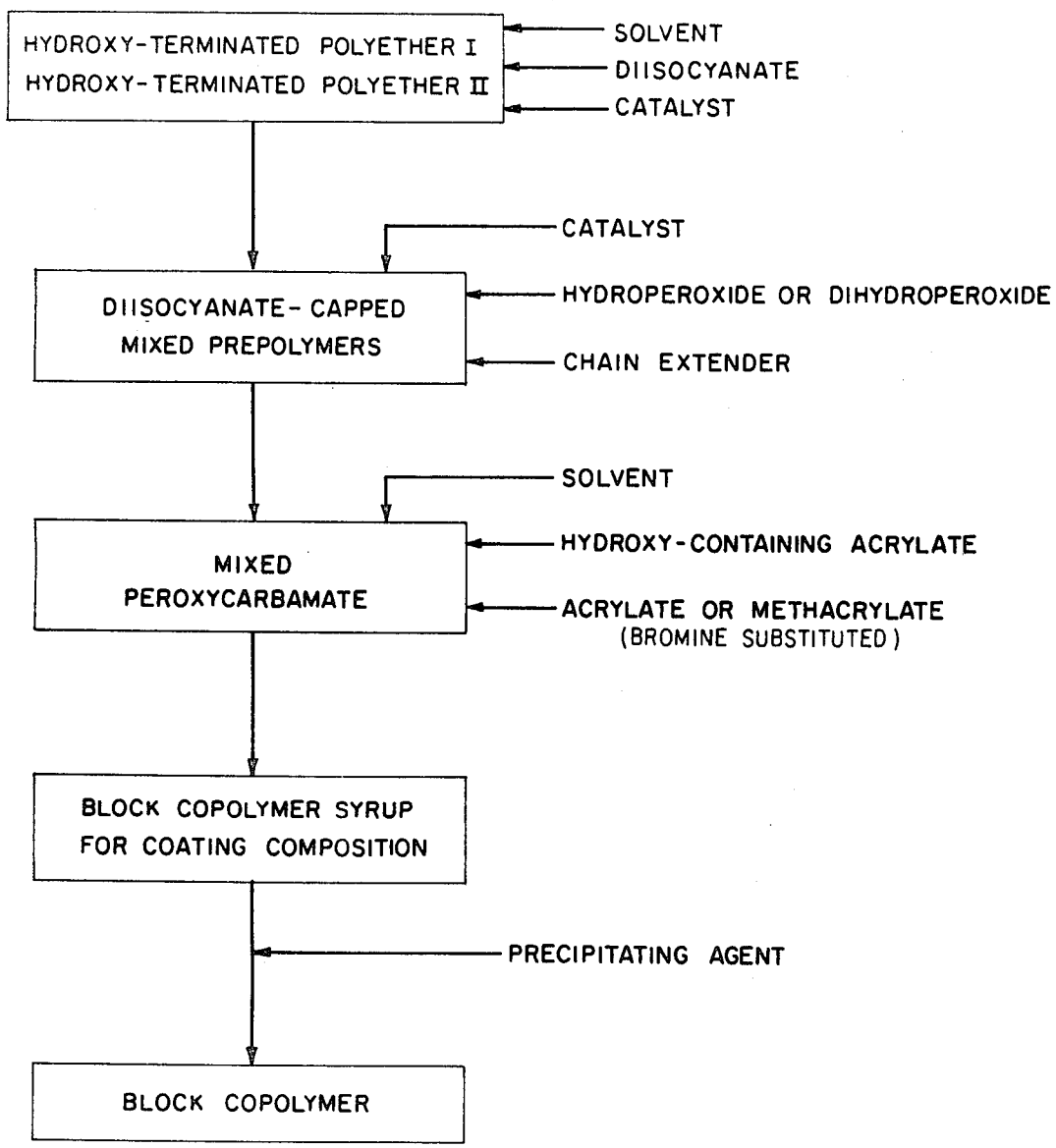
FIGS. 27–30 are flow diagrams illustrating three different embodiments (one of which has two modifications) of the preparation of a block copolymer syrup in accordance with this invention and based on the use of two different prepolymers for use in formulating a coating composition suitable for forming the ultraviolet-sensitive film.

The block copolymers of this invention are prepared by the same general method disclosed by Tobolsky in U.S. Pat. Nos. 3,865,898, 3,291,859, and 3,257,476. However, as discussed below, certain significant modifications in the basic Tobolsky technology are required in preferred embodiments. In accordance with the general method disclosed in the Tobolsky patents and diagrammed in FIG. 26, a polymeric constituent or prepolymer, such as polyether or a polyester, is reacted in the presence of a catalyst with a diisocyanate to form what is referred to as a "diisocyanate-capped" prepolymer. The preferred polyether is either a hydroxy-terminated polyoxypropylene or a hydroxy-terminated polyoxyethylene; and the preferred hydroxy-terminated polyester is one formed by reacting adipic acid with propylene glycol, ethylene glycol or mixtures thereof. The diisocyanate-capped prepolymer is then reacted in the presence of additional catalyst with a hydroperoxide or a dihydroperoxide, such as 2,5-dimethyl-2,5-bis(hydroperoxy)hexane to form a peroxycarbamate, such as bis(2,5-dimethyl-2-dihydroperoxyhexane-5-peroxycarbamate) polyether. Chain extension of the polyether polymer constituent may be effected in this second reaction if desired by addition of a suitable chain extender, such as butane-diol, to the reaction mixture. The peroxycarbamate is then reacted with one or more ethylenically-unsaturated monomers, the active sites in the peroxycarbamate serving to initiate the free radical polymerization of the monomer.

Further in accordance with teaching of Tobolsky, the reaction forming the peroxycarbamate is best conducted in a solvent, such as toluene, at about 50 percent by weight solids. The product of this reaction (i.e., the peroxycarbamate solution) may then be mixed with additional solvent and one or more ethylenically unsaturated monomers which form the polyvinyl blocks of the block copolymers. The final block copolymer may be formed by solution, dispersion or bulk polymerization depending upon the nature of the peroxycarbamate and the ethylenically unsaturated monomer.

In applying the teaching of Tobolsky to the formation of films for screen printing stencils which possess the desired chemical and physical properties, e.g., resistance to both water-based and oil-based inks, structurally stable but sufficiently flexible for screen printing, good adhesion, and the like, it is necessary to make significant modifications and improvements in the block copolymers of Tobolsky; and this in turn leads to significant modification in the basic Tobolsky method, particularly in the preferred method of this invention in which two different polyethers are used to form the block copolymer.

While the basic method of Tobolsky, as it applies to the formation of a block copolymer of this invention made from a single polyether, is illustrated in FIG. 26, FIGS. 27–30 illustrate diagrammatically the method of this invention applied to the formation of the block copolymer using two different polyethers. Although the discussion of these methods is presented in terms of using one or more polyethers, it will be understood that suitable polyesters may be substituted for the polyethers.

It has been found that it is desirable to use two different polymeric materials, e.g., polyethers. The mixing of two polyethers makes possible the attainment of the optimum balancing of physical and chemical properties in the final coating film on the printing screen stencil. Thus it is possible to more readily exercise control over the molecular weight of the polyurethane blocks and to balance the hydrophobic and hydrophilic characteristics of the film, which, in turn, makes the resulting screen printing stencil resistance to both water-based and oil-based inks. The combination of two different polyethers also imparts improved washout characteristics to the noncross-linked block copolymer in using a gel developer since the cross-linked polymer undergoes minimum swelling during development.

Figure 28:
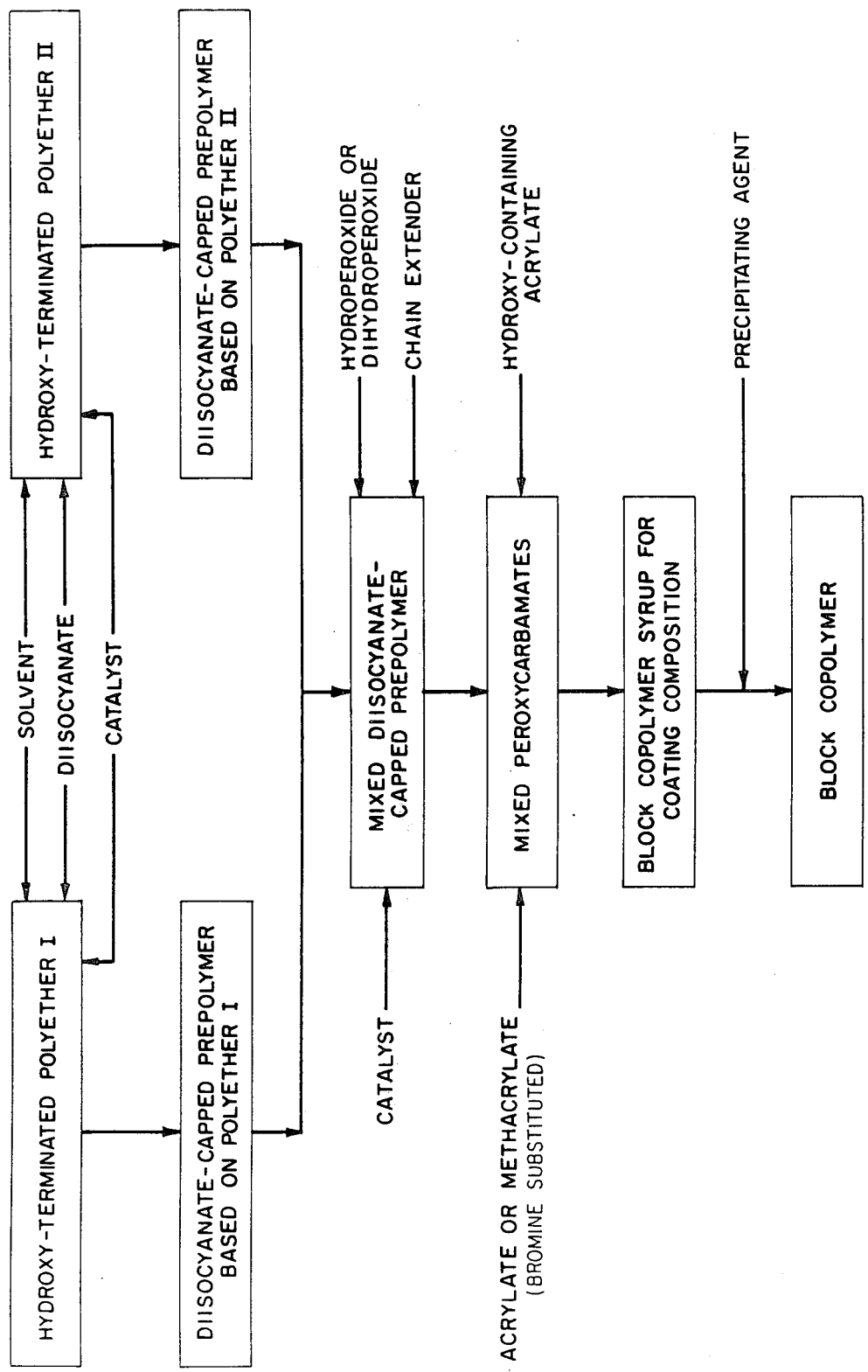
Figure 29:
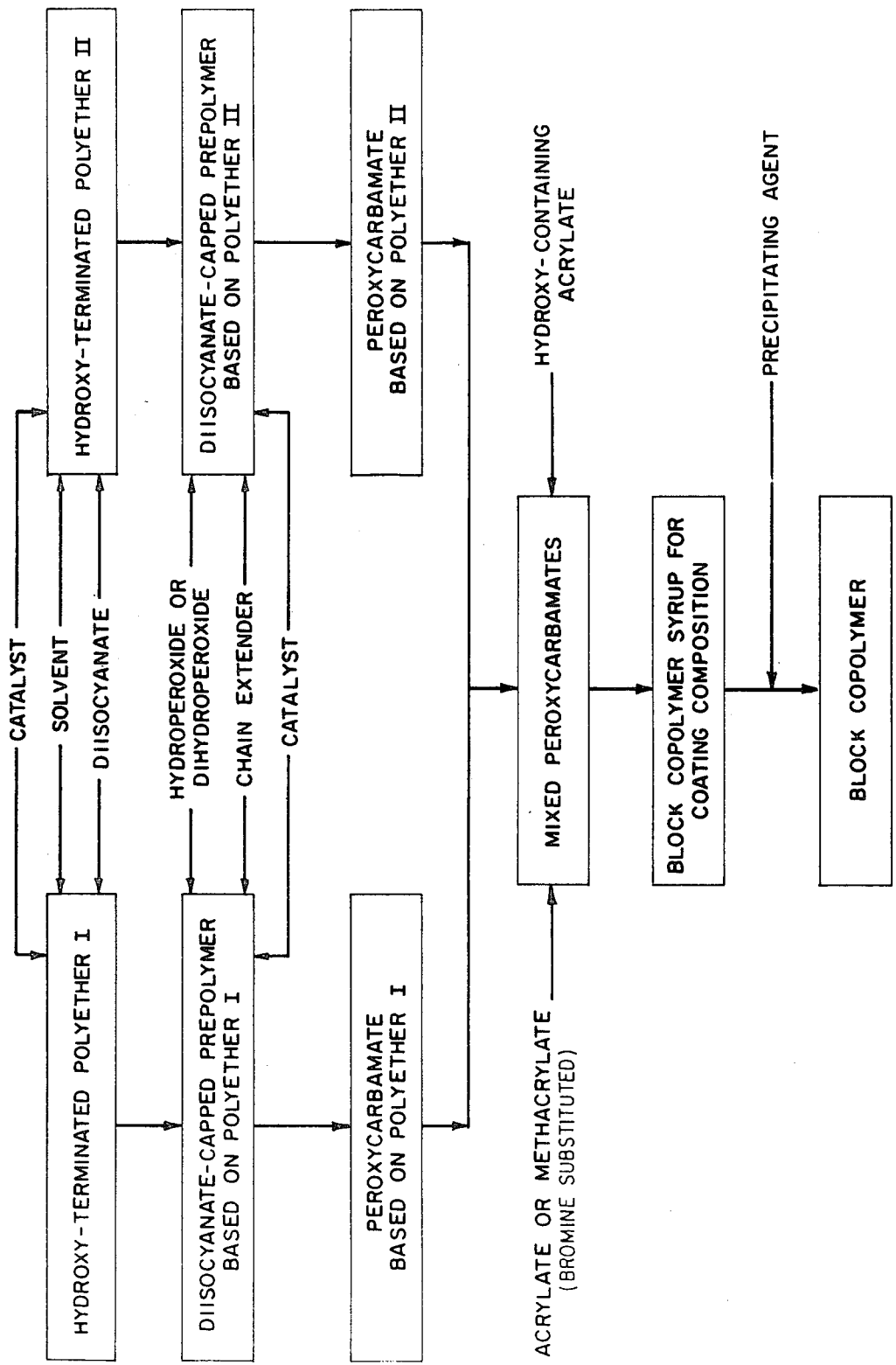
Figure 30:
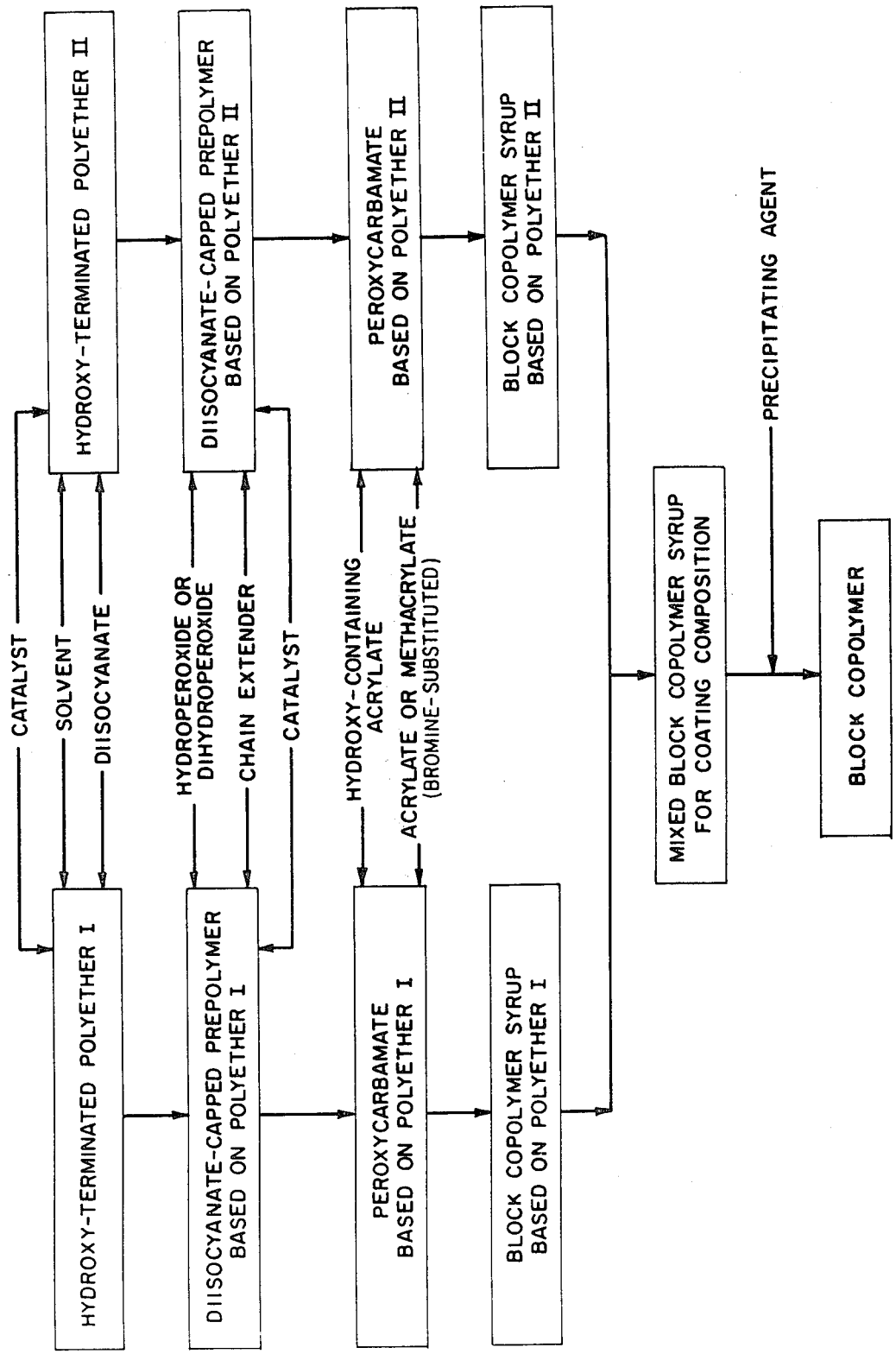

As will be seen from FIGS. 27–30, the two polyethers (preferably polyoxyethylene and polyoxybutylene) may be mixed prior to the formation of the diisocyanate-capped prepolymer (FIG. 27); they may be used to form separate diisocyanate-capped prepolymers which are mixed prior to the addition of the hydroperoxide or dihydroperoxide to form a mixed peroxycarbamate (FIG. 28); they may be used to form separate peroxycarbamates which are then mixed—a variation of the method of FIG. 28 (FIG. 29); or they may be used to form separate block copolymer syrups which are then mixed in the formation of the coating composition (FIG. 30). The last-named of these method embodiments is preferred for making screen printing stencils.

In addition to the polyoxybutylene which is used in combination with polyoxyethylene, the hydroxy-terminated ethers and esters disclosed by Tobolsky may also be used, either singly or in suitable combination to obtain a desired combination of chemical and physical properties.

The diisocyanates which may be used in the practice of this invention include, but are not limited to, toluene diisocyanate, bis(4-isocyanatocyclohexyl)methane, hexamethylene diisocyanate, 4,4′diphenylmethane diisocyanate, isophorone diisocyanate and trimethylhexamethylene diisocyanate. Bis(4-isocyanatocyclohexyl)methane is preferred.

The hydroperoxides and dihydroperoxides used in preparing peroxycarbamates in the practice of this invention are those having one or two terminal —OOH groups and include, but are not limited to, cumene hydroperoxide, t-butyl hydroperoxide, tetralin hydroperoxide, phenylcyclohexane hydroperoxide, diisopropyl benzene hydroperoxide, p-methane hydroperoxide, pinane hydroperoxide and 2,5-dimethyl-2,5-bis(hydroperoxy)hexane. Of these, 2,5-dimethyl-2,5-bis(hydroperoxy)hexane is preferred.

The hydroxy-containing acrylates used to form the copolyacrylate blocks of the block copolymers of this invention include, but are not limited to, 2-hydroxyethyl acrylate, hydroxypropyl acrylates, 2-hydroxyethyl methacrylate and hydroxypropyl methacrylates. Of these, 2-hydroxyethyl methacrylate is preferred. The acrylates used in the copolyacrylate blocks include, but are not limited to, the esters of acrylic acid such as methyl and ethyl acrylates and the esters of methacrylic acid such as methyl methacrylate and mixtures thereof.

It is also within the scope of this invention to use acrylates which are partially substituted with bromine as the acrylate monomer in forming the copolyacrylate blocks of the block copolymer of this invention. Exemplary of such bromine-substituted acrylates are dibromopropyl methacrylate and dibromopropyl acrylate.

The preparation of the block copolymers of this invention is illustrated in the following examples.

EXAMPLE 1

500 Grams of dry polyoxyethylene having a molecular weight range of 3000–4000, 292 grams of toluene, 93.7 grams of bis(4-isocyantocyclohexyl)methane and 0.5 gram dibutyltin dilaurate were added to a 1.5-liter, 3-necked reaction flask equipped with an agitator and a nitrogen purge and heated in a controlled temperature oil bath. The contents were purged with dry nitrogen and heated rapidly to 75° C. while being agitated. An isocyanate analysis (ASTM Test No. D2572-67T) was made after 5 hours at 75° C. and, based upon the results of this analysis, 16.3 grams of 2,5-dimethyl-2,5-bis(hydroperoxy)hexane, 7.9 grams of butane diol, 2.6 grams dibutyltin dilaurate and 189 grams toluene were added to the flask, and the temperature maintained at 50° C. for a period of 4 to 5 hours. At that time isocyanate analysis indicated an isocyanate content of less than 0.05 percent by weight, which was taken as an indication that the reaction was complete. The clear, viscous peroxycarbamate solution was transferred to glass bottles and refrigerated. Upon cooling, the product became a soft, waxy, opaque solid. Total solids were determined to be 54 percent by weight.

54.1 Grams of the peroxycarbamate thus formed, 71.8 grams of 2-hydroxyethyl methacrylate and 250 ml of ethylene glycol monomethyl ether were added to a 1000-ml, 3-necked flask, equipped with an agitator, a carbon dioxide purge, a thermometer and a pressure equalizing addition funnel, and heated by a controlled-temperature oil bath. The contents were mixed until all ingredients were dissolved. 43.1 grams of 2,3-dibromopropyl methacrylate and 94 ml of ethylene glycol monomethyl ether were then added to the addition funnel. Both the flask and the addition funnel were purged with carbon dioxide gas for 3 minutes, after which time a slow carbon dioxide purge was maintained by subsurface bubbling through the liquid in the flask, with the purge gas escaping through a fine-bore stopcock on top of the addition funnel. The temperature of the flask contents was brought to 80° C. and the 2,3-dibromopropyl methacrylate of the addition funnel was uniformly added over a 5-hour period. The temperature was maintained at 80° C. for an additional three hours after the last of the 2,3-dibromopropyl methacrylate had been added to assure completion of the reaction.

The resulting polymer syrup had a viscosity of 500 cps. at 24° C. and a total solids content of 29 percent by weight.

The same procedure was followed as described above, except that 2,3-dibromopropyl acrylate on an equal weight basis was substituted for the 2,3-dibromopropyl methacrylate. The resulting polymer syrup had a viscosity of 738 cps. at 16° C. and a total solids content of 28.1 percent by weight.

In forming a block copolymer syrup in which the bromine-substituted acrylate in the copolyacrylate bock is replaced by an unsubstituted acrylate or methacrylate, an amount of acrylate or methacrylate equal to the amount of bromine-substituted acrylate is added directly to the reaction flask with the remaining ingredients, thus eliminating the need for the addition funnel and stepwise introduction of this monomer.

EXAMPLE 2

181 Grams of dry polyoxyethylene having a molecular weight of about 2900, 80 grams of dry polyoxybutylene having a molecular weight of about 2000, 158 grams of toluene, 60 grams of bis(4-isocyanatocyclohexyl)methane and 0.25 gram dibutyltin dilaurate were added to a 1.5-liter, 3-necked reaction flask equipped with an agitator and a nitrogen purge and heated in a controlled temperature oil bath. The contents were purged with dry nitrogen and heated rapidly to 75° C. while being agitated. An isocyanate analysis (ASTM Test No. D2572-67T) was made after 5 hours at 75° C. and, based upon the results of this analysis, 9.9 grams of 2,5-dimethyl-2,5-bis(hydroperoxy)hexane, 5.6 grams of butane diol, 1.4 grams dibutyltin dilaurate and 153 grams toluene were added to the flask, and the temperature maintained at 50° C. for a period of 5 hours. An isocyanate analysis indicated that the reaction was essentially complete. The clear, viscous peroxycarbamate solution was transferred to glass bottles and refrigerated.

72 Grams of the peroxycarbamate, 100 grams of 2-hydroxyethyl methacrylate, 145 grams of ethylene glycol monomethyl ether and 169 grams of denatured ethyl alcohol were added to a 1000-ml, 3-necked flask which was equipped with an agitator, a carbon dioxide purge, a thermometer and a pressure equalizing addition funnel. The reaction flask was heated by a controlled-temperature oil bath. The contents were mixed until all ingredients were dissolved. 60 grams of 2,3-dibromopropyl methacrylate and 168 grams of ethyl alcohol were then added to the addition funnel. Both the flask and the addition funnel were purged with carbon dioxide gas for 3 minutes, after which time a slow carbon dioxide purge was maintained by subsurface bubbling through the liquid in the flask, with the purge gas escaping through a fine-bore stopcock on top of the addition funnel. The temperature of the flask contents was brought to 85° C. and the 2,3-dibromopropyl methacrylate in the addition funnel was uniformly added over a 3-hour period. The temperature was maintained at 85° C. for an additional three hours after the last of the 2,3-dibromopropyl methacrylate had been added to ensure completion of the reaction. The resulting polymer syrup had a viscosity of 270 centipoises at 24° C. and a total solids content of about 29% by weight.

As in the case of Example 1, an equal weight of an unsubstituted acrylate or methacrylate may be used in place of the 2,3-dibromopropyl methacrylate and added directly to the flask with the peroxycarbamate, 2-hydroxyethyl methacrylate and solvent.

EXAMPLE 3

A 1.5-liter resin reaction flask, equipped with an oil bath, temperature controller, dry nitrogen purge and high-torque air stirrer, was charged with 500 grams of polyoxybutylene (molecular weight about 2000) as a melt at 60° C. The flask, containing the melt, was swept with dry nitrogen while increasing the temperature to 80° C. with stirring. Then the polyoxybutylene melt was vacuum stripped for one hour with stirring, at which time the vacuum was released with dry nitrogen and 313 grams of toluene and 0.5 grams of dibutyltin dilaurate were added and uniformly blended in before adding 136 grams of bis(4-isocyanatocyclohexyl) methane. Nitrogen purging and rapid stirring was continued during the addition of these ingredients; then the flow of nitrogen was stopped and the stirrer speed reduced during the remaining reaction time of six hours. A temperature of 80° C. was maintained.

The completion of the reaction was checked by making an isocyanate analysis. With the completion of the reaction the temperature of the resulting diisocyanate-capped prepolymer in the flask was reduced to 50° C. To carry out the formation of the peroxycarbamate, 269 grams of toluene and 2.5 grams of dibutyltin dilaurate were added with a slow nitrogen purge and thoroughly mixed in. Then 19.7 grams of anhydrous 2,5-dimethyl-2,5-bis-(hydroperoxide)hexane was added with rapid stirring until it was completely dissolved. Finally, 8.5 grams of butane diol was added with stirring. The nitrogen purge was stopped and the reaction was allowed to proceed at 50° C. with moderate stirring for seven hours. A sample of the resulting peroxycarbamate was analyzed for —NCO content and found to be below 0.08% —NCO by weight—the preferred upper limit.

The resulting peroxycarbamate based on polyoxybutylene was a very viscous liquid (50 weight % solids) and was therefore discharged into a wide mouth container, while warm, for use in forming the block copolymer syrup. When cooled, this peroxycarbamate was a stable opaque, elastic, semi-solid. If it is to be kept for an extended period of time, it is preferable to store it in a refrigerator.

400 Grams of the polyoxybutylene-based peroxycarbamate, 2800 grams of ethylene glycol monomethyl ether, 500 grams of hydroxyethyl methacrylate and 300 grams of methyl methacrylate were charged into a 5-liter, oil heated flask and reacted at 85° C. for five hours in a carbon dioxide atmosphere. The resulting polyoxybutylene-based block copolymer syrup, which was very slightly yellow in color, had a solids concentration of 21 weight percent and a Brookfield viscosity of 500 centipoises at 25° C. using a No. 4 spindle at 50 rpm.

A polyoxyethylene-based block copolymer syrup was made in a similar manner. 500 Grams of polyoxyethylene (molecular weight about 4000) was charged as a predried powder along with 289 grams of toluene and 0.5 grams of dibutyltin dilaurate into a 1.5-liter resin reaction flask. Vacuum stripping was not necessary for the predried polyether powder used. The flask was continuously purged with dry nitrogen during the addition of the solvent and catalyst and the subsequent addition of 86 grams of bis-(4-isocyanatocyclohexyl)methane. Nitrogen flow was then cut off and the reaction was permitted to proceed at 80° C. for 6 hours with moderate stirring.

With the completion of the reaction (checked by isocyanate analysis), the temperature of the resulting diisocyanate-capped prepolymer was reduced to 50° C. and then 279 grams of toluene and 2.7 grams of dibutyltin dilaurate were added with a nitrogen purge. Subsequently, 19.0 grams of anhydrous 2,5-dimethyl-2,5-bis(-hydroperoxide)hexane was added with rapid stirring. Finally, 7.4 grams of butane diol was added, the nitrogen purge stopped, and the reaction allowed to proceed at 50° C. for seven hours. A sample of the resulting peroxycarbamate was analyzed and found to be below the maximum prescribed —NCO level.

The resulting peroxycarbamate based on polyoxyethylene was an opaque waxy solid (57.2 weight % solids).

400 Grams of the polyoxyethylene-based peroxycarbamate, 768 grams of ethylene glycol monomethyl ether, 1780 grams of absolute ethyl alcohol, 541 grams of hydroxyethyl methacrylate and 323 grams of methyl methacrylate were charged into a 5-liter, oil-heated flask and reacted at 85° C. for six hours in a carbon dioxide atmosphere. The resulting colorless, clear polyoxyethylene-based block copolymer syrup had a solids concentration of 27.5 weight % and a Brookfield viscosity of about 900 centipoises at 25° C. using a No. 4 spindle at 50 rpm.

EXAMPLE 4

Peroxycarbamates based on polyoxybutylene and on polyoxyethylene were prepared as described in Example 3.

400 Grams of the polyoxybutylene-based peroxycarbamate, 2800 grams of ethylene glycol monomethyl ether, 500 grams of hydroxyethyl methacrylate and 300 grams of 2,3-dibromopropyl methacrylate were charged into a 5-liter, oil-heated flask and reacted at 88° C. for seven hours in a carbon dioxide atmosphere. The resulting polyoxybutylene-based block copolymer syrup was clear amber in color and had a solids concentration of 25.9 weight percent and a Brookfield viscosity of 680 centipoises at 25° C. using a No. 3 spindle at 50 rpm.

400 Grams of the polyoxyethylene-based peroxycarbamate, 768 grams of ethylene glycol monomethyl ether and 1187 grams of absolute alcohol were added to a 5-liter, 3-necked flask which, in addition to a stirrer and thermometer, was also equipped with a pressure-equalizing addition funnel. 323 Grams of 2,3-dibromopropyl methacrylate and 588 grams of absolute alcohol were then added to the addition funnel and the contents of the flask were mixed until all ingredients were dissolved. Both the flask and the addition funnel were purged for a short time with carbon dioxide, after which time a slow carbon dioxide purge was maintained by subsurface bubbling through the liquid in the flask, with the purge gas escaping through a fine-bore stopcock on top of the addition funnel. The flask contents were maintained at 85° C. and the 2,3-dibromopropyl methacrylate in the addition funnel was added at a uniform rate over a three-hour period. The reaction was continued for an additional five hours at 85° C. Measurement of the viscosity of the syrup was used as a way of determining the attainment of the desired molecular weight of the block copolymer in the resulting syrup. The final polyoxyethylene-based block copolymer syrup had a solids content of 25.4 weight percent and a Brookfield viscosity of 220 centipoises using a No. 3 spindle at 50 rpm.

EXAMPLE 5

28.0 Grams of polyoxybutylene peroxycarbamate and 10.7 grams of polyoxyethylene peroxycarbamate prepared as described in Example 3 were charged into a flask. To the mixed peroxycarbamates were added 50 grams of 2-hydroxyethyl methacrylate, 281 grams of ethylene glycol monomethyl ether and 30 grams of dibromopropyl methacrylate. The flask was purged with carbon dioxide and the flask temperature was then raised to 85° C. and maintained under a carbon dioxide atmosphere. The reaction was carried out for about 7.5 hours.

The resulting block copolymer syrup was slightly amber in color, had a Brookfield viscosity of 220 centipoises at 25° C. using a No. 3 spindle at 50 rpm.

By substituting 30 grams of methyl methacrylate for the dibromomethacrylate and adding it to the flask along with the mixed peroxycarbamates, 2-hydroxyethyl methacrylate and solvents, it is possible to form a block copolymer syrup free of bromine.

The relative amounts of polyurethane and copolyacrylate in the block copolymer, as well as the relative amounts of the two types of acrylates making up the copolyacrylate blocks, may be varied to achieve desired combinations of characteristics in the films made with the block copolymers. Thus, the amount of polyurethane relative to the amount of copolyacrylate in the block copolymer may be chosen to achieve a balance between flexibility and durability. For example, the greater the amount of polyurethane in the block copolymer the greater will be the flexibility of the film; but at the sacrifice of some degree of durability. Decreasing the amount of polyurethane will increase durability and along with increased durability the degree of brittleness will be increased.

The amount of hydroxy-containing acrylate relative to the amount of other acrylate or methacrylate monomer in the copolyacrylate effects the solubility of the noncross-linked copolymer in polar solvents such as water/alcohol mixtures. This characteristic is of particular importance during the development of the indicia pattern in forming screen printing stencils.

Block copolymers having characteristics which are desirable for the making of screen printing stencils preferably comprise from about 60 to about 90 percent by block copolymer weight of copolyacrylate and from about 10 to about 40 percent by weight of polyurethane. The copolyacrylate preferably comprises from about 50 to about 95 percent by copolyacrylate weight of hydroxy-containing acrylate and from about 5 to 50 percent by weight of acrylate or methacrylate whether or not it contains bromine as a substituent. A preferred block copolymer for making screen printing stencils according to this invention is one comprising from about 60 to 80 percent copolyacrylate and from 40 to 20 percent polyurethane by weight, the copolyacrylate comprising from about 60 to 65 percent 2-hydroxyethyl methacrylate and from 35 to 40 percent acrylate or methacrylate by weight.

In addition to flexibility and durability, it is also possible to introduce other specific characteristics into the block copolymers by including in the copolyacrylate blocks certain other acrylates, in amounts of up to about 15 percent by copolyacrylate weight. Thus, for example, the substitution of acrylic acid for some of the hydroxy-containing acrylate will impart to the total copolymer a sensitivity to basic solvents, such as ammonia and sodium hydroxide solutions. This may be an important characteristic where it is desired to recycle used printing screens by washing the coatings from them with basic solvents. This particular substitution should only be made, however, in block copolymers used for preparing screen printing stencils for use with nonwater-based inks. This is because the water sensitivity of coating films made from block copolymers having this substitution is increased, thereby rendering them less durable in the presence of water than they would otherwise be. In those block copolymers in which the copolyacrylate blocks contain a bromine-substituted acrylate, the substitution of methyl methacrylate for some of the hydroxy-containing acrylate increases the hardness and water resistance of coating films made from the block copolymers, and the substitution of butyl methacrylate for some of the hydroxy-containing acrylate imparts improved flexibility to the coating films. Therefore, where such characteristics are of particular importance, the copolyacrylate block may comprise from about 50 to about 95 percent by copolyacrylate weight of hydroxy-containing acrylate, from about 5 to about 50 percent by weight of bromine-substituted acrylate and up to about 15 percent by weight of another acrylate, such as acrylic acid, methyl methacrylate or butyl methacrylate.

In those block copolymers in which the polyurethane blocks are formed using two different, but closely related, prepolymers, some additional control over the film properties is possible. For example, the use of a substantial amount of polyoxybutylene as a prepolymer contributes a high-degree of hydrophobicity to the film to decrease the swelling of the cross-linked block copolymer during developing and to impart added resistance to water-based inks during screen printing. Thus, it is possible to use up to as much as 70 percent by total prepolymer weight of the more hydrophobic polyoxybutylene in forming the block copolymer. The amount of polyoxybutylene may, however, be as low as 10% by prepolymer weight.

Moreover, the use of two prepolymers of different molecular weights permits the attainment of polyurethane blocks in the final block copolymer of a predetermined molecular weight, particularly with the use of chain extenders added to increase molecular weights to a desired degree. The use of two prepolymers to make two syrups which are subsequently blended also affords a final adjustment in the formulation of the coating composition in that the ratio of the syrups may be adjusted to attain desired performance characteristics, e.g., ease of wash-out, solvent and alkali resistance, flexibility, handling properties and the like.

The molecular weight of the final block copolymer, whether made using one or more prepolymers in forming the polyurethane blocks, must not be above that which permits the formation of a syrup with at least 15% solids concentration having a viscosity no greater than about 30,000 centipoises at 25° C. The optimum viscosity may easily be determined with reference to the technique employed in applying the coating composition containing the block copolymer. The monitoring of the molecular weight of the block copolymer as polymerization progresses is therefore easily accomplished by periodically measuring the viscosity of the syrup.

Although the block copolymers may be recovered from the syrups in which they are prepared by precipitating them in a precipitating agent such as an excess of water, removing the water and vacuum drying the precipitates, it is generally preferable to employ the syrups, such as those prepared in Examples 1-5, directly in the preparation of the coating compositions used to form the films in the preparation of the screen printing stencils. It is, however, within the scope of this invention to form the block copolymers as novel compositions and employ them for applications other than in the preparation of screen printing stencils.

In practicing this invention, it is preferable to apply the block copolymers to substrates (thin film or screen) as solutions in a suitable solvent system. It is also preferred to add to the solution at least one cross-linking promoter and at least one ultraviolet initiator. Thus, another aspect of this invention is the providing of a printing screen coating composition.

When the block copolymer syrup is used directly to form the coating composition, it is generally not necessary to add any additional solvent, since the solids level of the syrup itself is usually in the desired range, i.e., from about 20% to about 30% by weight. Thus, the cross-linking promoter and ultraviolet initiator along with any other desired additives may be added directly to the polymer syrup. When, however, a precipitated form of the copolymer is used in preparing the coating compositions of this invention, the copolymer is dissolved in a solvent to prepare a coating solution.

Although it is convenient for purposes of application to use coating compositions having solids contents of about 30 percent by weight, the solids level and therefore viscosity of the coating compositions may vary over a relatively wide range depending upon such factors as the application technique, the nature of the solvent used, the amount of cross-linking promoter added, the nature of the substrate being coated, and the like. Therefore, although solids levels of from about 20 to about 40 percent by weight of the coating composition are preferred, the practice of this invention is not limited to this range of solids levels. The formulation of the coating compositions of this invention to achieve solids levels or viscosities appropriate to the particular use contemplated is well within the expertise of those skilled in the art and need not be further defined.

The solvents used in preparing coating compositions according to this invention may be important factors in the handling of the coating compositions and formation of the screen printing stencils. Thus, where a relatively nonvolatile solvent is used, the time required to dry the coating, once applied to the substrate, could be so long as to present a processing disadvantage. On the other hand, if a highly volatile solvent is used, it may volatilize so rapidly as to make it relatively difficult to apply a uniform coating to the substrate. Therefore, solvents of intermediate volatility are preferred, among which are ethylene glycol monomethyl ether, ethyl alcohol, n-propyl alcohol, isopropyl alcohol, blends of ethylene glycol monomethyl ether with methylethyl ketone, ethyl alcohol, dimethyl formamide, isopropyl alcohol and the like. It is, of course, also within the scope of this invention to choose other organic solvents.

In formulating the coating composition of this invention, small amounts of ultraviolet initiators are included to accelerate the cross-linking or curing of the coatings upon exposure to ultraviolet irradiation. When exposed to ultraviolet radiation, these initiators are thought to generate free radicals which initiate the cross-linking of the block copolymer in the coating. Among the ultraviolet initiators which may be used in the coating compositions of this invention, phenanthrenequinone and uranyl nitrate are preferred since these initiators are more nearly matched against the spectral output of the more commonly used ultraviolet sources. Although an ultraviolet initiator concentration ranging from about 0.01% to about 5.0% by block copolymer weight may be used, concentrations ranging from about 0.1% to about 3% by weight are preferred.

The coating compositions of this invention also generally include small amounts of one or more cross-linking promoters in their formulation. These compounds serve to extend the degree of cross-linking which may be achieved by providing bridges or links between reactive sites of different block copolymer molecules. The nature of the cross-linking promoter and the amount used influence the degree of cross-linking, and therefore, the hardness and durability of the final coating. The hardness of the final coating, in turn, influences the performance characteristics of screen printing stencils having indicia defined by the films thus produced. For example, if an insufficient degree of cross-linking is achieved, the indicia-defining film tends to be too soft, and may not wear well during printing operations. If, on the other hand, too much cross-linking is achieved, the indicia-defining film tends to be too hard and brittle, and may crack during printing operations thereby resulting in defective prints. There are many known cross-linking promoters which may be advantageously used in formulating the coating compositions of this invention, and the optimum amount of this component may be readily determined without any undue experimentation. The preferred cross-linking promoters for use in preparing the coating compositions of this invention are those generally designated as multifunctional olefin cross-linking agents which include, but are not limited to, polyethylene glycol diacrylates, pentaerythritol triacrylate, trimethylolpropane triacrylate and mixtures thereof. These are preferably used at concentrations of up to about 20% by weight based on the total weight of block copolymer in the coating composition.

The addition of small amounts of a colorant, e.g., a pigmenting material, to the coating compositions of this invention improves the visibility of the coating composition during the preparation of the screen printing stencils and of the indicia on the final screen printing stencils. This may be an important factor in discovering errors or defects during the preparation of the screen printing stencils and prior to their use in printing operations. Phthalocyanine blue in concentrations of from about 0.1 to about 3.0 percent by block copolymer weight is exemplary of a suitable pigment for this purpose.

It has also been found desirable to add up to about 10% by block copolymer weight of a finely divided inert hydrophobic filler to eliminate blocking and surface tack and to limit the swelling of the cross-linked block copolymer during developing and subsequent spray washing out of the noncross-linked material. These fillers also contribute to the attainment of good edge definition in the finally produced indicia copy. Exemplary of such a filler is a hydrophobic silica sized 0.007 μm.

Finally, the solvent resistance of the films formed from coating compositions based on these block copolymers and hence of the printing screen stencils made may be improved by the addition to the coating composition of small amounts (i.e., about 1 percent by block copolymer weight) of dimethylaminoethyl acrylate.

In one embodiment of the method of making a coating composition in accordance with this invention the individual ingredients may be compounded using conventional techniques. Thus, for example, to the block copolymer in the form of a syrup may be added the ultraviolet initiator and cross-linking promoter. Alternatively, if the block copolymer has been recovered as a solid from the syrup, it is first made up as a solution. A conventional mixer, such as a high-speed mixer may be used, and the entire formulation procedure may be carried out at room temperature. Since the coating compositions of this invention are generally noncorrosive, conventional processing equipment may be used; however, it may be preferable to use stainless steel or glass lined equipment to minimize the possibility of contamination. This embodiment of the preparation of the coating compositions of this invention is further illustrated in Example 6.

EXAMPLE 6

The polymer syrup prepared in Example 1, containing 2,3-dibromopropyl methacrylate was mixed with phenanthrenequinone (ultraviolet initiator), trimethylpropane triacrylate (cross-linking promoter) and tetraethylene glycol diacrylate (cross-linking promoter) and filtered using a pressure filter. Phthalocyanine blue pigment (as a dispersion in ethylene glycol monomethyl ether) was added to the filtered solution which was then thoroughly mixed with a high-speed mixer to assure adequate pigment dispersion. The amounts of these ingredients are tabulated under composition "A" in Table 1. Since the resulting coating composition was light-sensitive, the formulation was carried out and the final product was stored in amber glass containers. A second coating composition ("B" in Table 1) was prepared by this procedure using the same polymer syrup as in Composition A, except that uranyl nitrate was used as the ultraviolet initiator. A third coating composition was prepared using the same procedure and the polymer syrup of Example 1 containing 2,3-dibromopropyl acrylate. A small amount of dimethylaminoethyl acrylate was added to the formulation. The formulation for this third coating composition is given as "C" in Table 1. Finally, formulation "D" exemplifies a coating composition using the polyoxyethylene-based block copolymer syrup of Example 3 and incorporating an inert filler.

Each of the these first three coating compositions was used to prepare screen printing stencils by the method of this invention. The resulting screen printing stencils were used to print with a standard laboratory printing press and produced satisfactory results. Formulation "D" was also suitable for the preparation of screen printing stencils.

Figure 31:
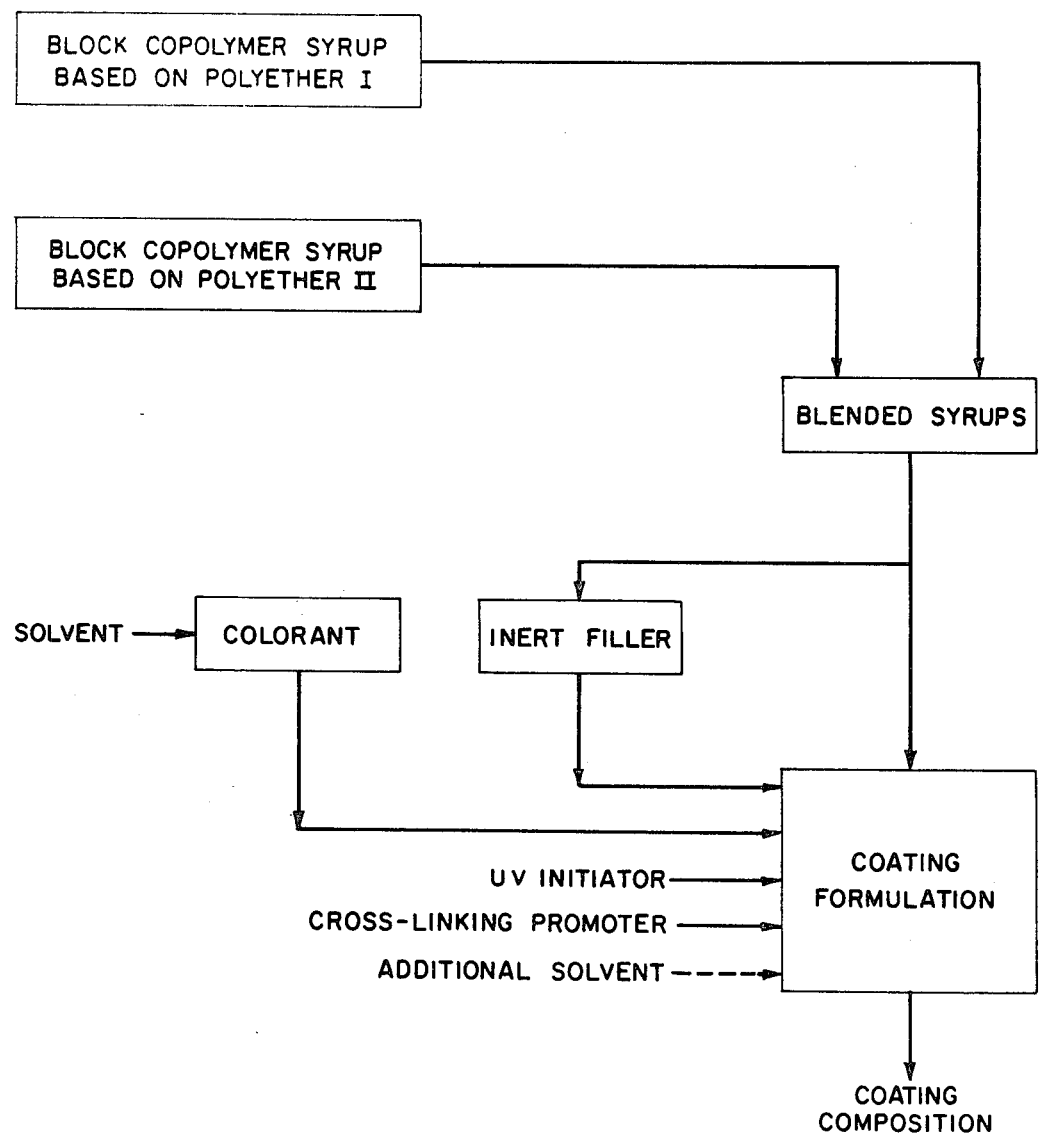
FIG. 31 is a flow diagram of a preferred method for formulating the coating composition of this invention.

A preferred method of formulating the coating compositions of this invention is diagrammed in FIG. 31 and illustrated in Example 7. In this preferred embodiment, the inert filler and colorant are separately compounded with a small amount of the polymer syrup and a suitable solvent, respectively, prior to their addition to the remaining syrup and the incorporation of the ultraviolet initiator and cross-linking promoter along with any additional solvent if required. This method embodiment is illustrated in Example 7.

TABLE 1

| Composition | Parts by Weight of Total Composition | | | |
|---|---|---|---|---|
| | A | B | C | D |
| Polymer syrup from Example 1 (containing 2,3-dibromopropyl methacrylate - 29% solids | 91.8 | 96.4 | — | — |
| Polymer syrup from Example 1 (containing 2,3-dibromopropyl acrylate - 28.1% solids) | — | — | 93.4 | — |
| Polyoxyethylene-based block copolymer syrup of Example 3 (containing 27.5% solids) | — | — | — | 96.8 |
| Phenanthrenequinone | 0.19 | — | 0.26 | 0.16 |
| Uranyl nitrate | — | 0.1 | — | — |
| Trimethylolpropane triaclyate | 2.1 | 0.6 | 0.6 | 0.82 |
| Triethylene glycol diacrylate | 2.1 | 0.6 | 0.6 | 0.82 |
| Phthalocyanine blue solution | 2.1* | 2.3* | 2.1* | 0.91** |
| Dimethylaminoethyl acrylate | — | — | 0.7 | — |

TABLE 1-continued

| Composition | Parts by Weight of Total Composition | | | |
|---|---|---|---|---|
| | A | B | C | D |
| Hydrophobic silica filler | — | — | — | 0.56 |

*8.7% solids in ethylene glycol monomethyl ether.
**16.1% solids in ethylene glycol monomethyl ether.

EXAMPLE 7

The two block copolymer syrups prepared in Example 4 were used in formulating a coating composition. A syrup blend was formed by adding 50 grams of the block copolymer syrup based on the polyoxybutylene ether (equivalent to 12.95 grams of the solid block copolymer) and 30 grams of the block copolymer syrup based on the polyoxyethylene ether (equivalent to 7.62 grams of the solid block copolymer) to a brown Nalgene bottle and rotating the bottle to mix the syrups.

A hydrophobic silica (average particle size of 0.007 μm) was used as the inert filler; and it was prepared by ball milling 0.53 grams with 16 grams of the blended syrups for 16 hours. Compounding was considered complete when it was possible to cast a smooth film from a sample of the filler/syrup blend. The colorant, phthalocyanine blue, was received as a paste made up in glycol ethyl ether; and it was diluted with ethylene glycol monoethyl ether to form a 16% by weight dispersion.

The filler/syrup blend and 0.87 grams of the phthalocyanine blue dispersion, were added to the remaining 64 grams of blended block copolymer syrup in the Nalgene bottle and after a preliminary stirring the mixture was transferred to a roller mixer to which were then added 0.15 gram of finely ground phenanthyrenequinone, 0.78 gram trimethylpropane triacrylate and 0.78 gram tetraethyleneglycol diacrylate. These ingredients were thoroughly mixed by rolling them with a small number of balls to form the final coating composition having a solids content of about 28%. This composition is suitable for forming screen printing stencils directly; or it may be stored at room temperature in a brown or amber bottle.

In those method embodiments in which the temporary support remains attached to the block copolymer film, e.g., the methods illustrated in FIGS. 1-17, it is necessary for the support to be essentially transparent to ultraviolet radiation. In all of the method embodiments requiring the use of a temporary support it should have a surface which permits adhesion to the film as well as release characteristics which permit separation from the film with little or no distortion of the film. Where necessary this adhesion between the film and the support should be sufficient to enable the engraving of certain parts of the coating film without disturbing the remainder of the film. Also where necessary, it should be strong enough to hold the image-defining cross-linked film during the development process when the support is treated with a water/alcohol solution or a gel developer is applied and then washed out with water spray. On the other hand, the adhesion between the film and the support should not be so strong as to interfere wth transfer of the film from the support to the printing screen, that is, the film should be readily released to the printing screen by the support.

In those cases where the film is cast on a temporary support, the support should be sufficiently flexible to enable good contact with the printing screen; and in those cases where the film remains attached to the support until after developing, the support should be inert to the solvents used in the development of the indicia pattern as well as to those used in preparing the coating compositions.

Although other materials may be used as temporary supports in the practice of this invention, thin films of polyethylene terephthalate (sold under the tradename MYLAR) coated with an appropriate adhesion/release agent are preferred. The polyethylene terephthalate films used are generally from 1 to 7 mils thick and preferably, about 3 mils thick. The adhesion/release agents with which the films are coated include, but are not limited to, thin films of natural or synthetic rubber applied to the support sheets as dilute (0.5-3 percent by weight) solutions in volatile mixed aliphatic/ketone solvents.

The printing screens used in the practice of this invention are highly porous carrier materials; and they are typically screens or fabrics made of polyamides, polyesters, silk, or metals such as copper, brass, bronze and stainless steel. The screens used generally have a mesh number of from 60 to 450, or more, i.e., they have from 60 to 450 openings per linear inch or from 3600 to 202,500 openings per square inch. Because of the nature of the block copolymer used to form the coating composition and the resulting film, and because of the coating formulation applied, the preferred screen for the practice of this invention is a yellow, orange or orange-red nylon fabric. This combination of screen material and color provides the needed resistance to the solvents contained in the coating compositions and prevents light scattering which would otherwise result in loss of detail in the prints made.

The coating compositions of this invention may be applied to the support or the screen by any suitable conventional techniques. For example, they may be applied by printing, knife-coating, rod coating or flow coating. Subsequent to the application of the coating composition to the substrate, it may be air dried, vacuum dried or oven dried.

In practicing this invention, satisfactory results are achieved with film thicknesses of from about 0.3 to about 3 mils, although this range is not critical, particularly in the method embodiment wherein the film is transferred to the screen before exposure to ultraviolet radiation. The coating may be applied in several layers to obtain the desired film thickness.

Figure 3:
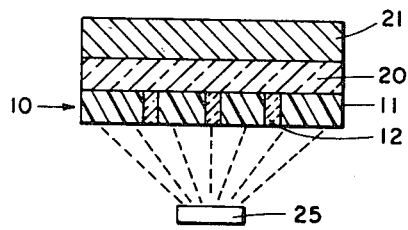
Figure 4:
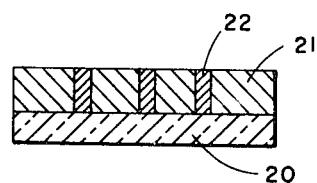
Figure 8:
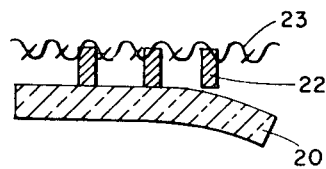
Figure 22:
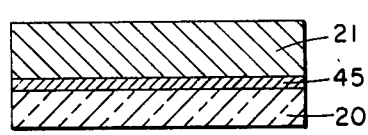
FIGS. 22–25 illustrate the steps of a fifth embodiment of a method for forming screen printing stencils wherein the ultraviolet-sensitive film/screen assembly is stripped from a temporary support before exposure.
Figure 23:
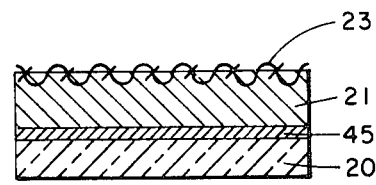
Figure 24:
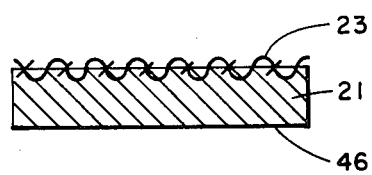

The amount of ultraviolet radiation used in forming the screen printing stencils of this invention will vary according to several parameters, such as coating thickness, amount of ultraviolet initiator used, degree of cross-linking desired, and the like. In this regard, it should be noted that less radiation is required for some steps than for others. Thus, where the coated support sheet is irradiated through a master, as shown in FIG. 3, to define an indicia with partially cross-linked material, it will suffice to irradiate it only to the extent required to render the affected part of the coating insoluble in the solvent used for the subsequent development step. Where, on the other hand, the irradiation is used to complete cross-linking and bond the indicia-defining coating to the printing screen, as shown in FIG. 8, somewhat more irradiation may be required. Thus, in practicing this invention, the coatings are irradiated with ultraviolet radiation of sufficient intensity for sufficient time to achieve the desired degree of cross-linking.

Among the ultraviolet radiation sources which may be used are carbon-arc lamps, high-intensity tungsten filament lamps, metal-halide lamps and mercury-vapor lamps. The following examples may be cited to illustrate suitable radiation intensity and exposure times. It will be appreciated that these will vary for different materials and different radiation sources. In the method embodiments in which exposure and developing are accomplished with the film attached to the support and cross-linking is effected stepwise a 12-ampere carbon-arc source and exposure at a distance of from about 15 to 20 inches for periods of from about 2 to 4 minutes are sufficient to partially polymerize the films and render them insoluble in the development solvent. Subsequent exposures at a distance of from about 10 to 15 inches for periods of from about 5 to 10 minutes are usually then sufficient to complete the cross-linking of the film on the printing screens.

In those method embodiments wherein the film is exposed directly to ultraviolet radiation (e.g., the method illustrated in FIGS. 22-25) there is no need for stepwise cross-linking and therefore it may be accomplished by a single exposure such as to a 12-ampere arc light spaced from about 15 to 20 inches from the film for about 5 to about 20 minutes. Exposure times, including less than 5 minutes, may also be used, the optimum exposure being dependent upon the ultraviolet source used.

As disclosed in copending application Ser. No. 844,633, the latent indicia pattern in the exposed film is preferably developed using a gel developer comprising (1) a solvent which is a mixture of water and a water-miscible organic liquid in which the block copolymer is soluble but in which the cross-linked block copolymer is insoluble and essentially nonswellable within the contact time required for the gel developer to soften and swell the block copolymer; and (2) an essentially inert, water-soluble thickener present in an amount sufficient to give the solvent a viscosity of between about 1,500 centipoises and about 50,000 centipoises at 25° C., as measured on a Brookfield viscometer Model RVF using a Number 6 spindle at 50 rpm. The gel developer provides a controlled release of the solvent when contacted with the film and thereby permits the attainment of an extremely sharp indicia pattern. The use of this gel developer comprises the steps of contacting the film formed of the copolyacrylate/polyurethane block copolymer in which the indicia pattern has been created in the form of cross-linked block copolymer with the gel developer for a time sufficient to soften and swell the noncross-linked block copolymer, and then mechanically removing the softened, swelled block copolymer by washing with a water spray.

Developing may also be done by washing out the noncross-linked film with a developer solution in which the block copolymer is soluble but in which the cross-linked block copolymer defining the indicia pattern are insoluble. Exemplary of such developer solutions are water/alcohol solutions such as water/ethanol or water/isopropanol mixtures wherein the ratio of water to alcohol may range from about 1/1 to about ⅓.

The method embodiments of this invention for forming screen printing stencils are further described in the following examples which are meant to be illustrative and not limiting.

EXAMPLE 8

An 8×10-inch support sheet of 3-mil polyethylene terephthalate film was coated with a thin layer of an adhesion/release agent applied as a dilute (0.75% by weight solids) solution of a transparent rubber cement in a volatile, mixed aliphatic/ketone solvent using a No. 3-wire-wound Meyer rod. After drying the adhesion/release agent, a coating of Formulation "A" of Example 6 was applied using a coating knife having a 10-mil clearance. The resulting coated support sheet was the air dried for about 2 hours and oven dried at 60° C. for an additional 2 hours.

The film was then exposed through the support and a test positive master (from the direction of the uncoated side) to a standard 12-ampere carbon-arc light at a distance of about 18 inches for a period of about 3 minutes. The exposed film-bearing support was then placed in an etching bath of ⅓ (volume) water/ethyl alcohol solution to dissolve unexposed noncross-linked film portions and produce an image of exposed, partially cross-linked film on the support. The image-bearing support was forced-air dried for about 10 minutes, and the image-defining film was transferred from the support to a clean, frame-mounted printing screen. This was accomplished by placing the support, film side up, on a flat, raised surface slightly smaller than the inside dimension of the printing screen frame; lowering the frame-mounted printing screen onto the support sheet with the ink or squeegee side up; swabbing the screen with a 1/1 water/ethyl alcohol blend; and allowing the assembly to stand for about 30 seconds to soften the surface of the coating. The screen was then covered with an absorbent paper and gently rolled to press the surface of the screen against the coated support sheet and to absorb excess solvent. Care was taken not to exert excessive pressure which would distort the image.

The screen/support assembly was then forced-air dried for about 15 minutes, after which the support was peeled off the printing screen leaving the film in the form of an indicia pattern on the printing screen. The film-bearing side of the printing screen was air dried for an additional 10 minutes; and then the printing screen was exposed to a standard 12-ampere carbon arc ultraviolet source at a distance of about 12 inches for 5 minutes on each side to complete the cross-linking of the image-defining film and promote its bonding to the screen. The resulting screen printing stencil was used to print with a standard laboratory screen printing press and produced satisfactory prints.

EXAMPLE 9

An 8×10-inch support sheet of 3-mil clear polyethylene terephthalate film was coated with a thin layer of an adhesion/release coating as a dilute (0.75 percent by weight solids) solution of a transparent rubber cement in a volatile, mixed aliphatic/ketone solvent using a No. 3 wire-wound Meyer rod. After the adhesion/release coating was dried, two successive applications of Formulation "A" of Example 6 were applied using a casting knife with a clearance of 6 mils. After each layer of the coating composition was applied, the coated support was air dried for 2 hours and oven dried at 60° C. for 2 additional hours.

A clean, frame-mounted printing screen was then placed in contact with the coated side of the support. A thin film of the printing screen coating composition of Formulation "A" cast on the free surface of the screen as an adhesive to bond the screen to the film on the support sheet, after which the entire assembly was forced-air dried about 10 minutes. The assembly was the exposed through a test negative to a standard 12-ampere carbon-arc ultraviolet source at a distance of about 18 inches for a period of about 3 minutes. The support was then removed, leaving the film on the printing screen. The printing screen was placed in an etching bath of 1/1 (by volume) water/ethyl alcohol solution to dissolve out the unexposed film and leave a printed positive image of exposed, partially cross-linked film on the printing screen. The developed printing screen was forced-air dried for about 10 minutes on each side and then exposed to a standard 12-ampere carbon-arc ultraviolet source at a distance of about 12 inches for about 10 minutes on each side. The resulting screen printing stencil was used to print with a standard laboratory screen printing press and produced a number of good prints.

EXAMPLE 10

An 8×10-inch support sheet of 3-mil clear polyethylene terephthalate film was coated with a thin layer of an adhesion/release coating applied as a 3 percent by weight solution of a transparent rubber cement in a solvent comprised of a heptane/hexane/methyl ethyl ketone mixture using a No. 7 wire-wound Meyer rod. After the adhesion/release coating was dried, two successive castings of he coating composition of Formulation "A" of Example 4 were applied using a casting knife having a clearance of 6 mils. The film-coated sheet was air dried for 2 hours and oven dried for 2 hours at 60° C. after each layer of the coating composition was applied.

A sharp stencil-cutting knife was used to cut a design in the dried film taking care not to score the polyethylene terephthalate film itself. The unwanted portion of the film was peeled away from the support sheet and discarded. The completed design was transferred to a printing screen by the technique described in Example 8, and the indicia-defining film was cross-linked by exposure to ultraviolet irradiation as described in Example 8.

The resulting screen printing stencil was used to print 400 copies of the design using a standard laboratory screen printing press. Of the 400 copies, 200 were made with a commercially available water-based ink and, after cleaning the screen printing stencil, 200 more copies were printed using a commercially available ketone-based ink.

Visual inspection of the screen printing stencil after printing 400 copies with it showed no sign of wear, and the stencil appeared to be in substantially the same condition as it was prior to being used to print the 400 copies.

EXAMPLE 11

This example is directed to the preferred embodiment of the method of this invention for making a film-bearing support and for forming a screen printing stencil therefrom. Reference should be had to FIGS. 21-25 which illustrate the articles produced and to FIG. 32 which details the method steps.

A release coating was applied to a 3-mil polyethylene terephthalate film with a No. 3 Meyer coating rod and dried by passing through a hot air oven at 50° C. to form a primed support. The coating composition of Example 7 was applied with a reverse roll coater to the printed support surface and forced-air dried at 68° C. to form a first essentially solvent-free 0.55-mil film of the block copolymer composition on the support. Subsequently, an additional quantity of the coating composition was applied as a second layer and forced-air dried under identical conditions. Different samples were prepared with sufficient quantities of the coating composition being applied in the second coating step to produce film-bearing supports having final film thichnesses of 0.9 mil, 1.0 mil and 1.15 mils. All three of these film thicknesses yielded high quality screen printing stencils.

The resulting film-bearing support in itself represents a unique article of commerce which may be stored for extended periods of time under conditions which prevent any appreciable ultraviolet radiation from reaching it. During such storage it may be desirable to insert an interleaving material, e.g., a two-mil film of polyethylene, between layers of the film-bearing support. A film-bearing support having a one-mil thick film will be used in describing the remaining steps of this Example.

Both 280-mesh and 320-mesh nylon screens dyed to be balanced orange in color were used and found equally satisfactory. The screens were degreased with a commercially available degreasing agent and then treated with denatured ethanol just before being attached to the exposed surface of the film on the polyethylene terephthalate support, the ethanol serving to tackify the film surface before bonding the screen thereto. The resulting support/film/screen assembly was forced-air dried at room temperature for one-half hour before the support was stripped off. To ensure that no residual primer remained on the freed surface of the film, it was wiped with hexane and forced-air dried for an additional half hour to form a film/screen assembly suitable for exposing.

The exposure of the film-bearing screen was done in a vacuum frame setting normally used for this purpose. A 23-inch mercury vacuum was used; and exposure was for 10 minutes using a 12-ampere arc lamp spaced 16 inches from the test master.

The gel developer used was formulated according to the teaching of Ser. No. 844,644 and more particularly according to the composition designated "Number 3" of Table 1 in Example 2, incorporated herein by reference.

The gel developer was applied to both sides of the exposed block copolymer film/screen assembly by brushing on with a two-inch paint brush. Care was taken to ensure that both surfaces were completely covered. So long as the screen and polymer surfaces were completely covered, the actual thickness of the gel developer coats was not important. Typically, gel developer coating thicknesses may range between about one-sixteenth inch to about one-quarter inch, the thinner coatings being preferred. Techniques other than brushing, e.g., knife coating or rod coating, may, of course, be used to apply the gel developer to the film-bearing screen.

The gel developer was allowed to remain for 10 minutes in contact with the film-bearing screen, after which time it was removed by washing off with a spray of water at a temperature of 80° F. It is preferable to use water at this temperature under about 60 psig line pressure to ensure complete removal of gel developer and noncross-linked block copolymer. The resulting screen printing stencils were then dried at room temperature in an air stream for at least 30 minutes.

The screen printing stencils were then evaluated to determine their ability to produce prints of good overall quality in which the patterns were of high fidelity. In printing the screen printing stencil was first firmly positioned from about ⅛ to ¼ inch above the paper receptor surface and then loaded with ink. Printing was accomplished by drawing a sharp squeegee at an angle of about 45° to the paper over the ink-loaded screen to force it into contact with the paper surface so that ink flowed through those areas in the screen printing stencil which were free from the indicia pattern film.

Commercially available screen printing inks—oil based and water-based—were used in evaluating the screen printing stencils formed. The indicia pattern used was a standard test pattern wherein the letters varied in size from 14 to 4 point and lines in thicknesses from 10 to 4 mils and were printed as white on black and black on white. It was possible, using these screen printing stencils developed and both types of ink to consistently print copies of the standard test pattern on paper in which the smallest letters and the finest line thicknesses were sharp, clear and well-defined throughout the entire letters. This was the case for both the white-on-black and black-on-white letters.

In keeping with known practice, the screen printing stencils of this invention may be used to print on such substrates as paper, fabric, plastic and the like.

The screen printing stencils of this invention represent a substantial advancement of the art in that they are compatible with both oil-based and water-based inks. More specifically, these screen printing stencils combine the precision of photochemically prepared screen printing stencils with the durability normally associated with alkaline and water-resistant coatings used with water-based inks. The use of water-based inks in screen printing processes, enabled by the screen printing stencils of this invention, is environmentally advantageous in that it lessens or eliminates the chance of solvent escape into the atmosphere.

Although this invention has been described in terms of specific embodiments which are set forth in detail, it should be understood that such embodiments are illustration only, and that the invention is not necessarily limited thereto, since alternate embodiments and techniques will become apparent to those skilled in the art in view of the disclosure. Accordingly, modifications are contemplated which can be made without departing from the spirit of the described invention.

We claim:

1. An article of manufacture suitable for use in the formation of screen printing stencils, comprising in combination
   (a) a temporary support; and
   (b) an ultraviolet cross-linkable film removably affixed to said temporary support, said film comprising a uv-initiated crosslinking promoter, an ultraviolet initiator, and a block copolymer formed of blocks of a copolyacrylate and a polyurethane, said copolyacrylate comprising a copolymer of a hydroxy-containing acrylate and a second acrylate component which comprises one or more esters of a non-hydroxy-containing acrylic acid or methacrylic acid or mixtures thereof; said film in its cross-linked form being further characterized as resistant to both water-based and oil-based printing inks.

2. An article of manufacture in accordance with claim 1 wherein said temporary support is essentially transparent to ultraviolet radiation whereby said film may be exposed to ultraviolet radiation through said support and thus be at least partially cross-linked while affixed to said support.

3. An article in accordance with claim 1 wherein said blocks of said polyurethane are formed from at least one polyether.

4. An article in accordance with claim 3 wherein said blocks of said polyurethane are formed from two polyethers.

5. An article in accordance with claim 4 wherein said polyethers are polyoxybutylene and polyoxyethylene, the amount of said polyoxybutylene used being up to about 70 weight % of the total weight of said polyethers.

6. An article in accordance with claim 5 wherein said block copolymer comprises from about 60% to about 90% copolyacrylate and from about 10% to about 40% polyurethane by block copolymer weight, said copolyacrylate comprising from about 50% to about 95% of said hydroxy-containing acrylate and from about 5% to about 50% of said second acrylate component by copolyacrylate weight and said polyurethane is formed of polyoxybutylene and polyoxyethylene used in a weight ratio of from about 10 to 90 to about 70 to 30.

7. An article in accordance with claim 1 wherein said second acrylate component is partially substituted with bromine.

8. An article in accordance with claim 1 including a printing screen permanently affixed to said cross-linkable film.

9. A liquid coating composition suitable for forming an ultraviolet-cross-linkable film on a substrate, comprising
   (a) a block copolymer formed of blocks of a copolyacrylate and a polyurethane, said copolyacrylate comprising a copolymer of a hydroxy-containing acrylate and a second acrylate component which comprises one or more esters of a non-hydroxy-containing acrylic acid or methacrylic acid or a mixture thereof;
   (b) a solvent for said block copolymer;
   (c) an ultraviolet initiator, and
   (d) at least one cross-linking promoter.

10. A coating composition in accordance with claim 9 wherein said copolyacrylate includes up to about 15% by copolyacrylate weight of acrylic acid.

11. A coating composition in accordance with claim 9 wherein said hydroxy-containing acrylate is 2-hydroxyethyl acrylate, a hydroxypropyl acrylate, 2-hydroxyethyl methacrylate or a hydroxypropyl methacrylate.

12. A coating composition in accordance with claim 9 wherein said blocks of said polyurethane are formed from at least one polyether.

13. A coating composition in accordance with claim 12 wherein said blocks of said polyurethane are formed from two polyethers.

14. A coating composition in accordance with claim 13 wherein said polyethers are polyoxybutylene and polyoxyethylene, the amount of said polyoxybutylene used being up to about 70 weight % of the total weight of said polyethers.

15. A coating composition in accordance with claim 14 wherein said block copolymer comprises from about 60% to about 90% copolyacrylate and from about 10% to about 40% polyurethane by block copolymer weight, said copolyacrylate comprising from about 50% to about 90% of said hydroxy-containing acrylate and about 5% to about 50% of said second acrylate component by copolyacrylate weight and said polyurethane is formed of polyoxybutylene and polyoxyethylene used in a weight ratio of from about 10 to 90 to about 70 to 30.

16. A coating composition in accordance with claim 9 wherein said second acrylate component is at least partially substituted with bromine.

17. A coating composition in accordance with claim 16 wherein said acrylate partially substituted with bromine is 2,3-dibromopropyl methacrylate.

18. A coating composition in accordance with claim 16 wherein said copolyacrylate includes up to about 15% by copolyacrylate weight of methyl methacrylate, butyl methacrylate or acrylic acid.

19. A coating composition in accordance with claim 16 wherein said block copolymer comprises from about 60% to about 90% copolyacrylate and from about 10% to about 40% polyurethane by block copolymer weight, said copolyacrylate comprising from about 50% to about 95% of said hydroxy-containing acrylate and from about 5% to about 50% of acrylate substituted with bromine by copolyacrylate weight.

20. A coating composition in accordance with claim 9 wherein said solvent is ethylene glycol monomethyl ether, ethyl alcohol, n-propyl alcohol, isopropyl alcohol, blends of ethylene glycol monomethyl ether with methyl ethyl ketone, ethyl alcohol, dimethyl fromamide, or isopropyl alcohol, or mixtures thereof.

21. A coating composition in accordance with claim 9 wherein said ultraviolet initiator is phenantrenequinone or uranyl nitrate in an amount equivalent to between about 0.01% and about 5% by block copolymer weight.

22. A coating composition in accordance with claim 9 wherein said cross-linking promoter is a polyfunctional olefin cross-linking agent present in an amount up to about 20% by weight of said block copolymer.

23. A coating composition in accordance with claim 22 wherein said cross-linking agent is a polyethylene glycol diacrylate, pentaerythritol triacrylate, trimethylolpropane triacrylate or mixture thereof.

24. A coating composition in accordance with claim 9 including from about 0.1% to about 3% by block copolymer weight of a pigment.

25. A coating composition in accordance with claim 24 wherein said pigment comprises phthalocyanine blue.

* * * * *